United States Patent [19]
Yamashita et al.

[11] Patent Number: 5,783,342
[45] Date of Patent: Jul. 21, 1998

[54] METHOD AND SYSTEM FOR MEASUREMENT OF RESIST PATTERN

[75] Inventors: Kazuhiro Yamashita, Hyogo; Masahiro Muro, Osaka, both of Japan

[73] Assignee: Matsushita Electric Industrial Co., Ltd., Osaka, Japan

[21] Appl. No.: 579,355

[22] Filed: Dec. 27, 1995

[30] Foreign Application Priority Data

Dec. 28, 1994 [JP] Japan ................................ 6-326624
Sep. 22, 1995 [JP] Japan ................................ 7-244061

[51] Int. Cl.⁶ .................................................. G03F 7/20
[52] U.S. Cl. ................................ 430/30; 430/311; 356/357
[58] Field of Search ........................... 430/30, 311, 394, 430/396; 250/492.1, 492.2, 492.22; 356/319, 345, 346, 357, 358

[56] References Cited

U.S. PATENT DOCUMENTS

| 5,124,927 | 6/1992 | Hopewell et al. | |
| 5,252,414 | 10/1993 | Yamashita | 430/22 |
| 5,409,538 | 4/1995 | Nakayama | 118/688 |
| 5,543,918 | 8/1996 | Abraham | 356/376 |

FOREIGN PATENT DOCUMENTS

| 3-85722 | 4/1991 | Japan . |
| 4-155813 | 5/1992 | Japan . |
| 6-112104 | 4/1994 | Japan . |

*Primary Examiner*—Kathleen Duda
*Attorney, Agent, or Firm*—McDermott, Will & Emery

[57] ABSTRACT

An overlay measurement pattern, which is formed in a master pattern of a mask, is selectively transferred by exposure processing onto a resist film on a wafer of semiconductor material. This is followed by detecting, by means of a two-beams interference method, a reference position for the overlay measurement pattern formed by the variation in film thickness occurring at an exposed resist region, with performing no development processing. A reference position for an overlay reference pattern, which is pre-formed in the semiconductor wafer, is detected using an interference pattern produced by white light, to detect an overlay difference between the patterns. Since neither a test exposure process nor a development process is needed to be carried out, this results in not only providing a higher throughput rate but also eliminating factors that contribute to degradation of the accuracy of overlay caused by base line stability and mask alignment repeatability. A higher overlay accuracy is achieved accordingly.

17 Claims, 22 Drawing Sheets

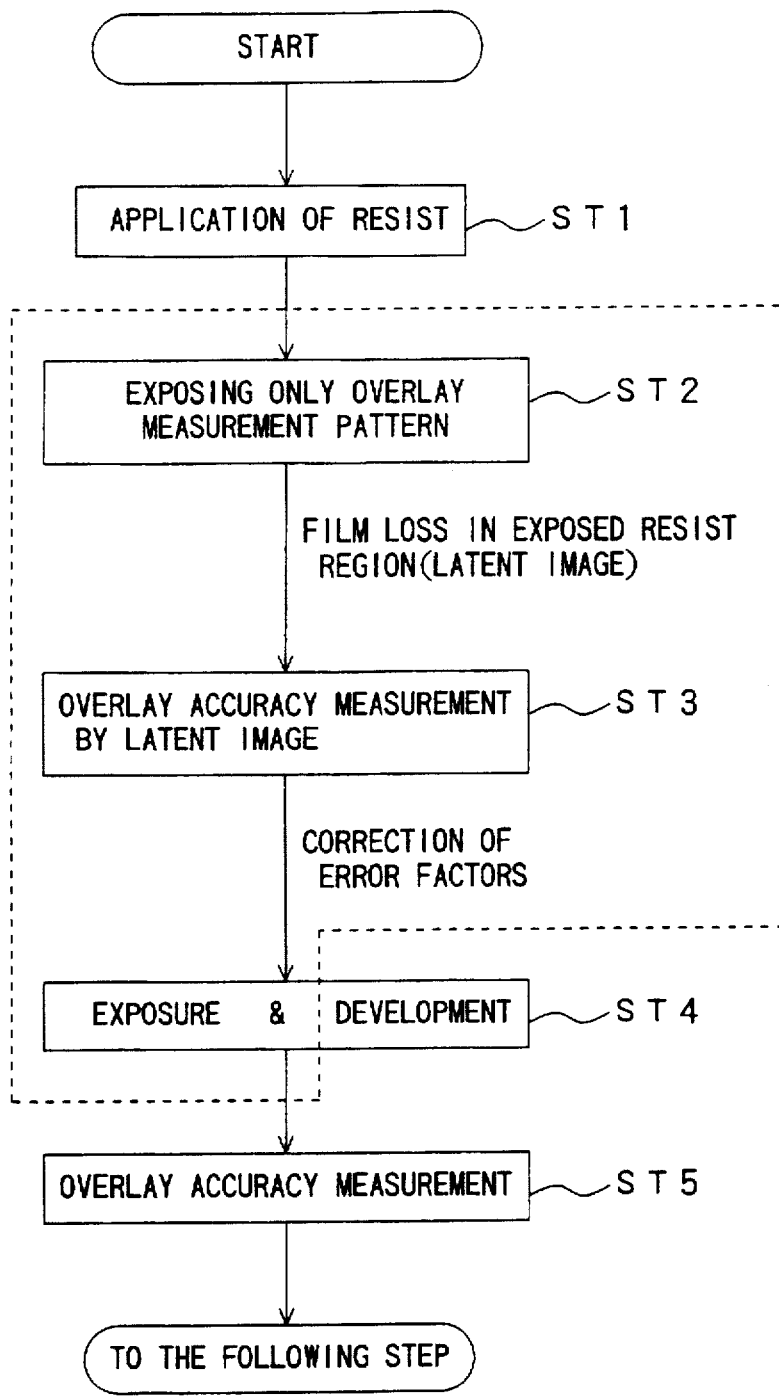

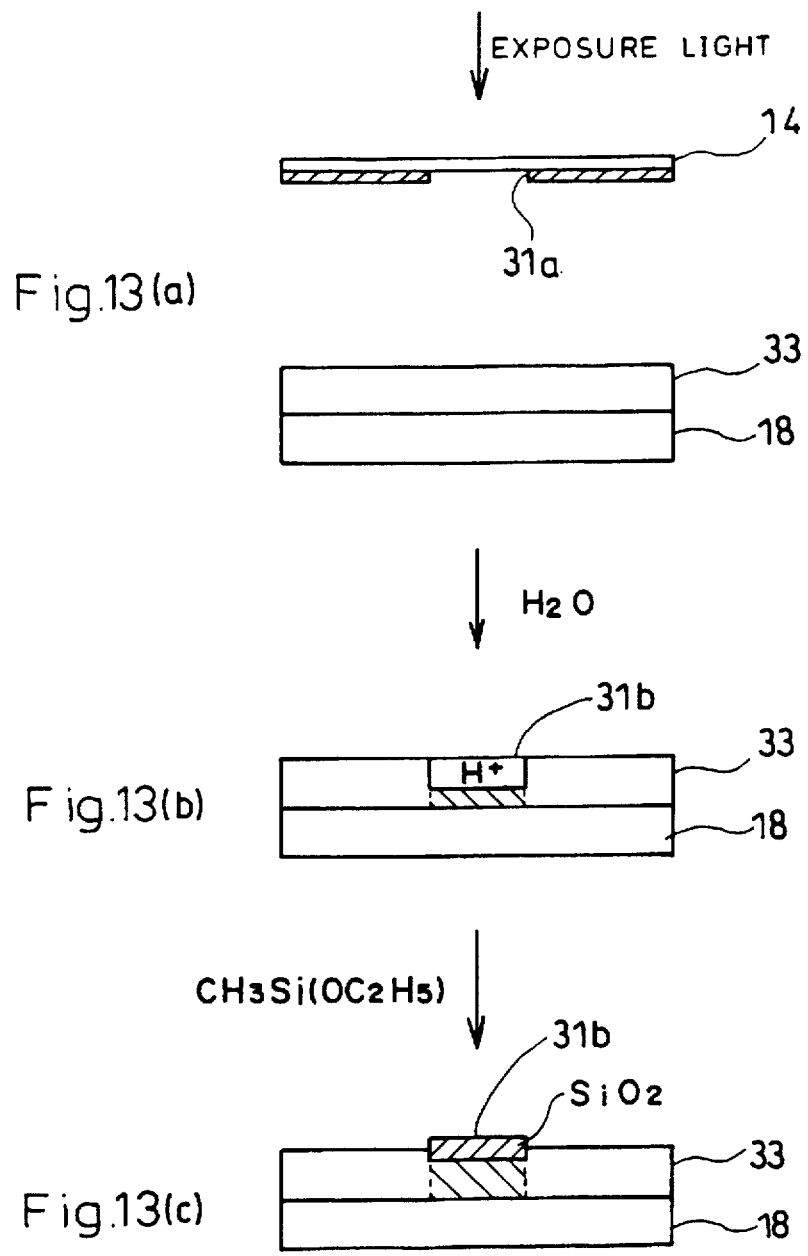

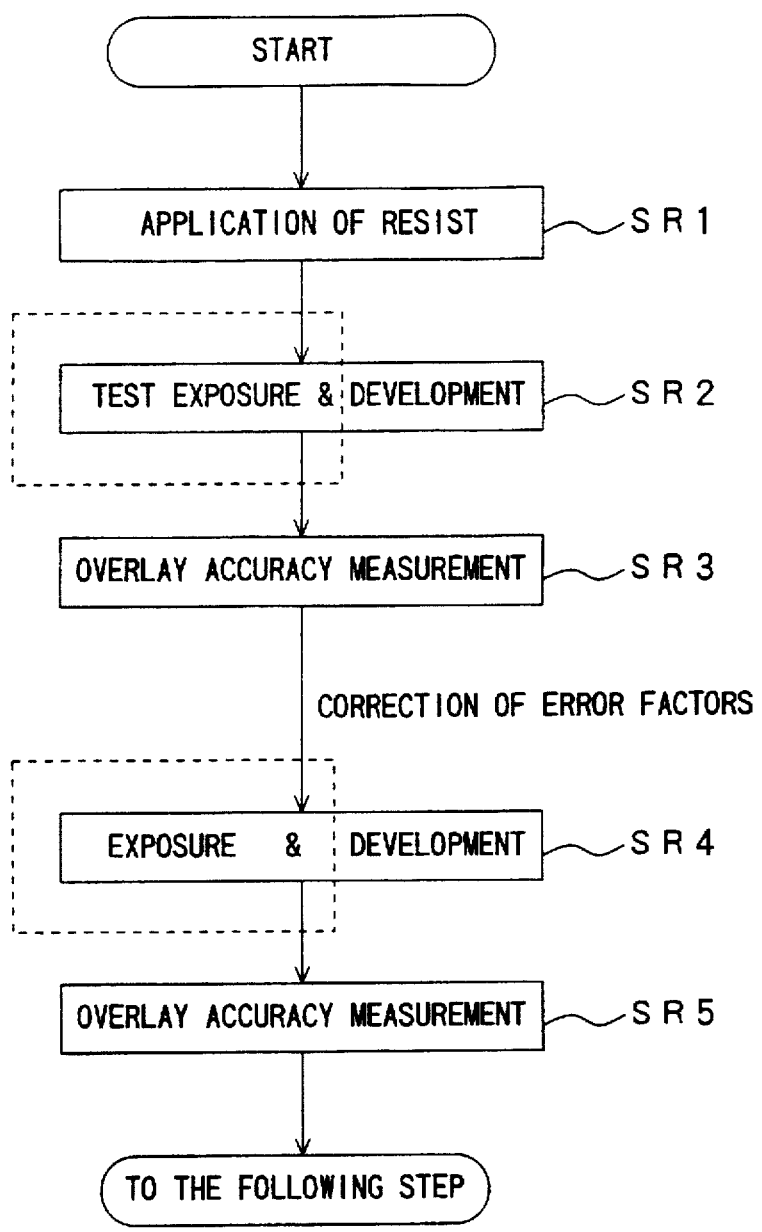

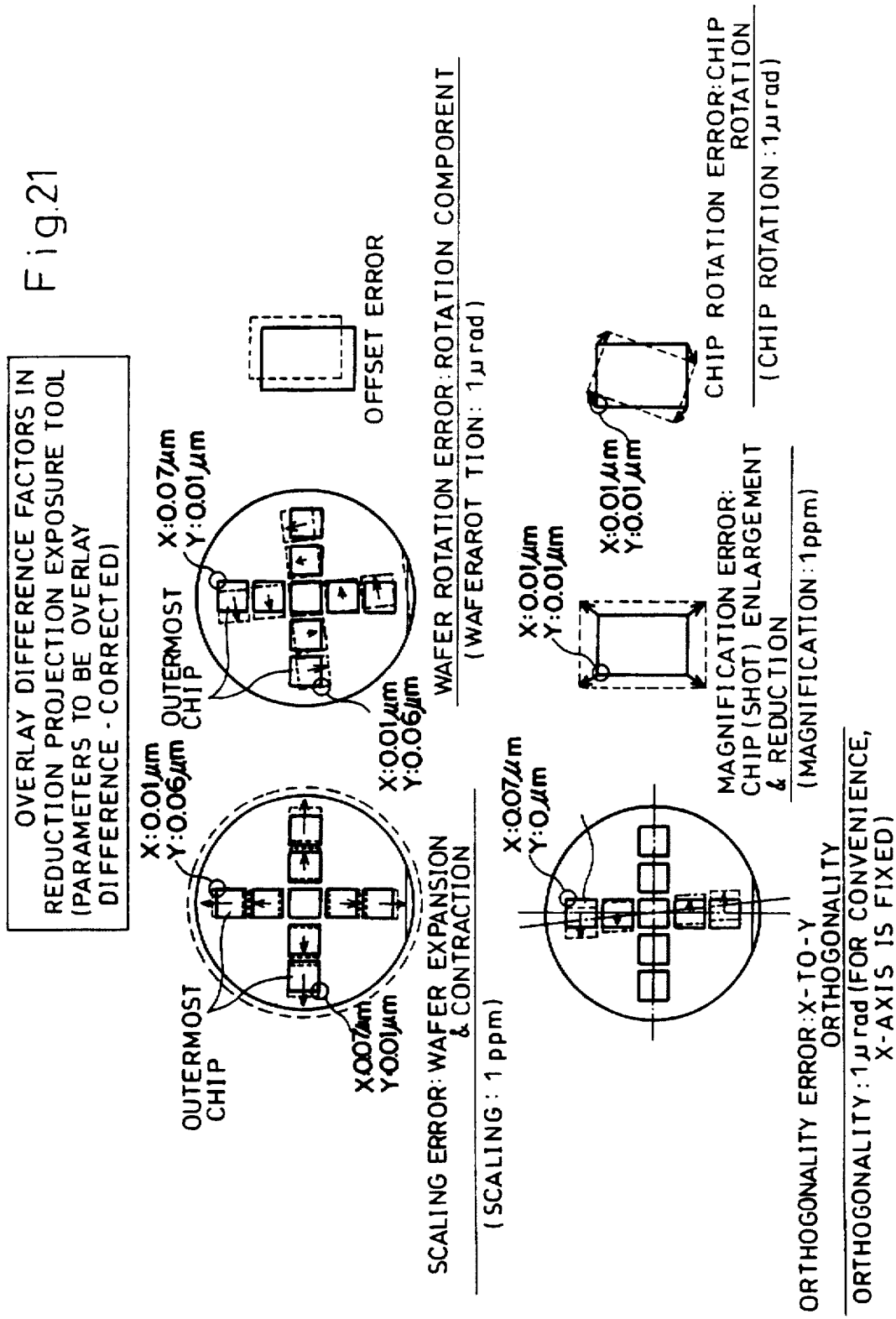

Fig.22(a)
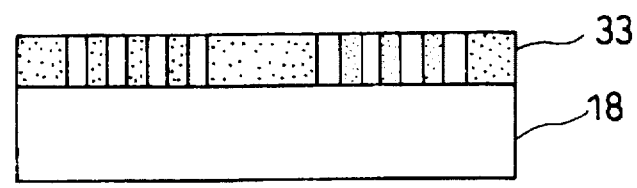
Fig.22(b)
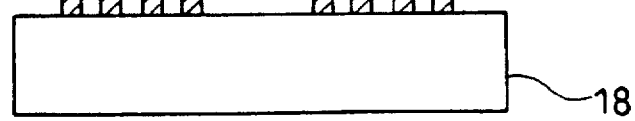
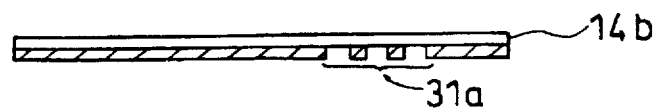
Fig.22(c)
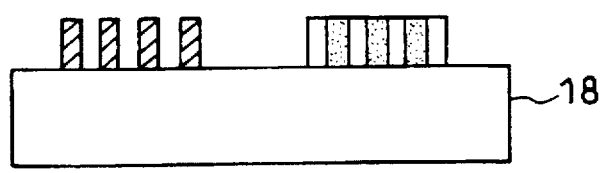
Fig.22(d)
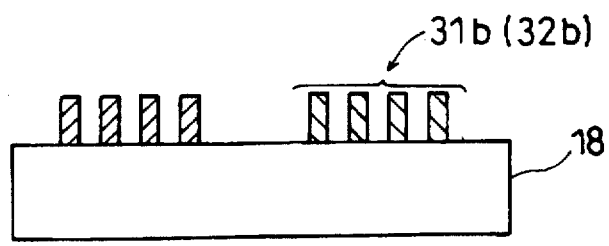

METHOD AND SYSTEM FOR MEASUREMENT OF RESIST PATTERN

BACKGROUND OF THE INVENTION

The present invention relates to a method and system or measurement of the position and dimensions of a resist pattern that is formed on a wafer of semiconductor material.

Reduction projection exposure tools have been used for transfer of fine circuit patterns. As the density level of semiconductor devices becomes higher, a reduction projection exposure tool, which is capable of achieving high resolution as well as high overlay accuracy, is required. Recent technological advances in shortening the wavelength of exposure light achieve sub-halfmicrometer patterns. In order to achieve semiconductor devices having sub-halfmicrometer patterns, an overlay accuracy of below 0.1 μm must be accomplished. The problem is that it is difficult to provide such a high overlay accuracy because of possible errors such as offset produced by expansion and contraction of semiconductors and variations in exposure-tool base line.

Conventionally, a technique, in which a monitor wafer is used, has been proposed to achieve high overlay accuracy. More specifically, in the technique, a monitor wafer is subjected to a test exposure process and then to a development process to find an overlay difference amount. Thereafter, the amount is corrected. This conventional method is explained by making reference to the accompanying drawing figures.

FIG. 20 is a flow diagram illustrating steps of a correction method of correcting the amount of overlay difference in a conventional semiconductor photolithography process. At step SR1, a resist film is applied to the surface of a semiconductor substrate. At step SR2, one semiconductor wafer of a semiconductor wafer lot, which serves as a monitor wafer, is subjected to a test exposure process through a mask having an overlay measurement pattern. Subsequently, the monitor wafer is subjected to a development process. At step SR3, the amount of overlay difference is measured to calculate overlay error factors as shown in FIG. 21. Based on the result of the calculation, overlay error factors, e.g., offset, rotation, and scaling, are extracted. Thereafter, at step SR4, the factors extracted are corrected, and each of the remaining wafers of the lot is subjected to an exposure process and then to a development process. At step SR5, overlay accuracy is re-measured.

FIG. 22 shows cross-sections of a semiconductor wafer and cross-sections of a mask at the time of measuring the amount of overlay difference. As shown in FIG. 22(a), a mask 14a is placed above a semiconductor wafer 18 overlaid with a resist film 33. The resist film 33 is exposed to light through the mask 14a. The mask 14a has alignment marks 21a that become a master pattern and an overlay reference (OR) pattern 32a. As a result of the exposure, each pattern is transferred to the resist film 33, whereupon a latent image of an alignment mark 21b and a latent image of an OR pattern 32b are produced on the resist film 33. Next, as shown in FIG. 22(b), the resist film 33 is developed, whereupon the alignment mark 21b and the OR pattern 32b are formed on the semiconductor wafer 18. Next, as shown in FIG. 22(c), a mask 14b, which has an overlay measurement (OM) pattern 31a that becomes a master pattern, is placed above the wafer 18 using the alignment mark 21b so that the mask 14b is arranged at the same position that the mask 14a was arranged. This is followed by an exposure process and then a development process so as to form an OM pattern 31b next to the OR pattern 32b. It is to be noted that the right halves of FIGS. 22(a), (b) and the right halves of FIGS. 22(c), (d) are cross-sectional views taken at different sections. As will be described later, a two-beam interference method is employed to measure the amount of position difference between the OM pattern 31b and the OR pattern 32b, in order to determine the overlay accuracy of a reduction projecting exposure tool (see FIGS. 9(a)–(c)).

The above-noted technique, however, suffers the following drawbacks.

The first drawback is that of one semiconductor wafer lot at least one wafer must serve as a monitor wafer. Additionally, the monitor wafer is subjected to a test exposure process and thereafter to a development process. This means that, when a test exposure process to a monitor wafer of a lot and the following exposure process to each of the remaining wafers of the lot are to be carried out in succession using the same exposure tool, the operating efficiency of the exposure tool is reduced because it lies idle between such different exposure processes.

The second drawback is as follows. If a different lot is to be dealt with between a test exposure process and the subsequent exposure process, this requires a mask to be replaced with another. As a result, overlay accuracy is ill-influenced by mask alignment repeatability (base line error).

The last drawback is as follows. If a chemically amplified resist is used as lithography material, this produces the problem that, since a developer used comes into contact with an unexposed region of the resist when a first exposure process is carried out to form an alignment mark and an OR pattern, the resist surface comes to have a low solubility. As a result, even if an exposure process is carried out with a view to transferring a mask pattern having the OM pattern 31a onto the OR pattern 32b on the wafer 18 (see FIG. 22(c)), no pattern is formed on the wafer 18 by a development process.

SUMMARY OF THE INVENTION

Bearing in mind the above-described problems with the prior art techniques, this invention was made. Therefore, a general object of the present invention is to provide an improved method and system capable of eliminating the problems.

The present invention discloses a resist-pattern measurement method. This method comprises the steps:

(a) providing a source of electromagnetic waves including light and radiation capable of performing a function of producing a chemical change to a resist film applied to a surface of a wafer;
   providing a mask having a specific pattern made up of an electromagnetic wave-transmitting region and an electromagnetic wave-shielding region;
   exposing the resist film to electromagnetic waves emitted from the source through the mask;

(b) leaving the post-exposure resist film for at least one minute without performing a development process thereon, to manifest a resist pattern;
   the resist pattern being made up of an exposed resist region of the resist film that has undergone a change in thickness and an unexposed resist region of the resist film the thickness of which has remained unchanged;

(c) sensing reflection light reflected by a surface of the exposed resist region and reflection light reflected by a surface of the unexposed resist region, for resist pattern measurement.

In accordance with the above-described method, after an elapse of one minute, the exposed resist film undergoes thickness variation, in other words there is created a difference between the height of the surface of the exposed resist film and the height of the surface of the unexposed resist film (hereinafter referred to as SLD (surface level difference)). When a resist film, which suffers film loss (i.e., decrease in film thickness) when exposed to light, is used, an exposed region of the resist film stands further back than an unexposed region of the resist film, forming a recess portion. On the other hand, a resist film, which undergoes film gain (i.e., increase in film thickness), is used, an exposed region of the resist film undergoes a rise in surface height, forming a projection portion. As a result of such arrangement, when such a resist film is exposed to light, beams of light reflected by the surface of the exposed resist region and beams of light reflected by the surface of the unexposed resist region together produce, for example, an interference pattern. Observation of such a figure makes it possible to determine not only the resist pattern position but also the amount of SLD without developing the exposed resist film. Also, it becomes possible to perform alignment in which a resist pattern serves as a mask and to determine an adequate exposure dose (energy).

In the above-described method, it is preferred that the step (c) of the above-described method is carried out, provided that there is produced a surface level difference of 0.5 µm or more between the exposed resist region surface and the unexposed resist region surface.

Such arrangement provides an SLD sufficient for enabling detection of a resist pattern shape by making use of an interference pattern produced by light. As a result, it is ensured that the position of the exposed region and the variation in film thickness of the exposed region are detected.

It is preferred that the exposed resist region is heated in the step (b) of the above-described method.

As a result of heating the resist film, the resist material promptly undergoes chemical changes, in other words it undergoes a great thickness variation in a short length of time. This produces improvement in the throughput.

It is preferred that the wafer is a wafer which is prepatterned to have a reference pattern of recess portions and projection portions and the above-described method further comprises the steps of:

(d) detecting a reference position for the reference pattern by sensing both reflection light reflected by a surface of the recess portion via the resist film and reflection light reflected by a surface of the projection portion via the resist film;

wherein in the step (c) a reference position for the resist pattern is detected from reflection light reflected by the exposed resist region surface and reflection light reflected by the unexposed resist region surface, to measure the amount of position difference between the reference position of the reference pattern and the reference position of the resist pattern.

As a result of such arrangement, the amount of position difference between the reference position of the reference pattern and the reference position of the resist pattern is determined without the need for performing a development process on the exposed region. This enables the omission of a step for position difference measurement performed by a test exposure process and a development process.

It is preferred that in the step (d) light with a wide spectrum is used and in the step (c) two coherent-light beams are used.

As a result of such arrangement, when detecting a reference position for the reference pattern needed to be measured by allowing beams of light with a wide-spectrum to pass through the resist film, the reference position is detected by observing a resulting interference pattern. Therefore, even if standing waves are produced due to multiple reflection interference occurring within the resist film when illuminated with the wide-spectrum light, the effects of the standing waves are cancelled by wavelength components. Beams of light reflected by the recess portion and beams of light reflected by the projection portion produce a clear interference pattern, and the reference position of the reference pattern is detected accurately. On the other hand, an interference pattern is produced by beams of coherent light reflected by the exposed region surface and beams of coherent light reflected by the unexposed region, so that the sensibility of detection of SLD can be held high making it possible to accurately detect even a slight SLD, in other words the amount of position difference between the reference position of the reference pattern and the reference position of the resist pattern is accurately determined.

It is preferred that the mask of the step (a) is a mask having a master pattern for alignment mark formation and a master pattern for reference pattern formation, and the method further comprises the steps of:

(e) performing alignment of the wafer with the aid of an alignment mark formed by means of transfer of the alignment-mark formation master pattern onto the resist film;

(f) performing a second exposure process in order that a master pattern for the resist pattern is transferred onto the resist film;

(g) performing a development process on the resist film, and thereafter measuring the amount of position difference between a reference position for the reference pattern and a reference position for the resist pattern by making use of the resist pattern and the reference pattern.

In accordance with the above-described arrangement, an alignment mark, which is defined by a surface level difference, produced by a first exposure process, between the exposed resist film and the unexposed resist film, is used for wafer alignment. As a result of such arrangement, even if another exposure process is carried out successively to form an overlay measurement pattern on the resist film, this will not cause the resist film to have a low solubility since no development process is carried out after the first exposure process. This enables continuous exposure processing.

It is preferred that the mask has a circuit pattern, a master pattern that is used to form the resist pattern, and a master pattern that is used to form the reference pattern, each of which is to be formed on the wafer, and the master patterns are separated from the circuit pattern by a shield region.

Such arrangement enables selective exposure capable of exposing only an overlay measurement pattern to light through the same mask as used for circuit pattern transfer.

It is preferred that in the step (c) an interference microscope is used to detect a variation with time in the intensity of interference of reflection light reflected by the exposed resist region surface and reflection light reflected by the unexposed resist region surface at the time when the wafer is scanned in its height direction, to detect a surface level difference between the exposed resist region and the unexposed resist region, and that the method further comprises the steps of:

(h) finding, based on the detected surface level difference, a difference between an energy dose of the step (a) and an optimum energy dose by making use of a pre-found correlation between exposure dose and surface level difference.

It is preferred that in the step (c) a confocal microscope is used to detect a variation with time in the intensity of interference of reflection light reflected by the exposed resist region surface and reflection light reflected by the unexposed resist region surface at the time when the wafer is scanned in its height direction, to detect a surface level difference between the exposed resist region and the unexposed resist the met and that the method further comprises the steps of:

(i) finding, based on the detected surface level difference, a difference between an energy dose of the step (a) and an optimum energy dose by making use of a pre-found correlation between exposure dose and surface level difference.

It is preferred that in the step (c) the confocal microscope is a confocal microscope having a light source which emits beams of coherent light.

As a result of these arrangements, an adequate exposure dose can be determined, and photolithography parameters are determined easily.

It is preferred that the resist film is a chemically amplified resist formed of a resist material containing protecting groups that are released when exposed to light.

Chemical changes occur when a chemically amplified resist film is exposed to light because its protecting groups are released by such exposure, whereupon variation in film thickness occurs to the resist film. As a result of such thickness variation, there is defined a great surface level difference between the exposed resist film region and the unexposed resist film region, and the amount of surface level difference signal obtained from an interference pattern increases, which ensures that the amount of position difference between a resist pattern and a reference pattern is measured.

It is preferred that the chemically amplified resist is reduced in volume upon exposure to light because of said protecting groups being released.

As a result of such arrangement, the exposed resist film region undergoes loss in film thickness and stands further back than the unexposed resist film region to define a great surface level difference therebetween.

It is preferred that the chemically amplified resist is composed of a polymer having a chemical composition as indicated by the following chemical formula (1), and an acid generator:

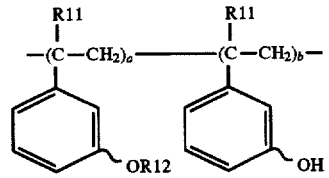

where R11 is either an atom of hydrogen or a methyl group while R12 is a group having the following formula (2) and is selected among —$CH_2COOR_{19}$ groups, tert-butoxycarbonyl groups, tetrahydroxypyranyl groups, and trimethylsilyl groups;

where:

(i) R16 and R17 each indicate either an atom of hydrogen, or an alkyl group having either a linear chain form or a branching form where the number of atoms of carbon contained therein falls in the range of one to three;

(ii) R18 indicates either an alkyl group having either a linear chain form, or a branching form, or a cycle form where the number of atoms of carbon contained therein falls in the range of one to six, or an alkoxy group having either a branching form or a cycle form where the number of atoms of carbon contained therein falls in the range of one to six;

(iii) R19 is either an alkyl group having a linear line form or a cycle form where the number of atoms of carbon contained therein falls in the range of one to six, or an alkoxy alkyl group having a branching form or a cycle form where the number of atoms of carbon contained therein falls in the range of three to eight.

It is preferred that the dose of the acid generator is 5%, on a weight basis, of the dose of the polymer.

As a result of these arrangements, the resist film has protecting groups that are easily released by acid, as a result of which $CO_2$ gas is generated at the exposed resist region. The exposed resist region therefore undergoes great loss in thickness, in other words the thickness of the exposed resist region of the resist film decreases, thereby facilitating identification of the resist pattern.

It is preferred that in the step (a) a silylation agent is used to silylate hydroxyl groups contained in said resist film.

Such arrangement contributes to facilitating measurement of the resist pattern without the need for performing a resist development process. This achieves a higher throughput.

It is preferred that the step (a) is carried out at an exposure dose that is 1.5 times an exposure dose at which the ratio of resist pattern finish size to reticle size is one to one (1:1).

It is assured by such arrangement that a great surface level difference is defined between the exposed resist region and the unexposed resist region in a short length of time.

It is preferred that the resist film is formed of a resist material which increases in volume upon exposure to light.

It is preferred that the resist film, formed of a resist material which contains photoacid generator groups, is exposed to ultraviolet light, and is subjected to a CVD process using alkoxysilane vapor for selective generation of polysiloxane in the vicinity of a surface of the exposed resist region of the resist film.

As a result of these arrangements, the resist film undergoes gain in thickness, in other words the thickness of the resist film increases. A surface level difference is defined between the exposed resist region and the unexposed resist region, thereby enabling optical resist-pattern detection.

The present invention provides a resist-pattern measurement system wherein a resist film, formed on a wafer having a reference pattern of recess portions and projection portions, is exposed to light through a mask having a pre-determined pattern, to form a resist pattern, and wherein a surface level difference, defined by the exposure between a surface of an exposed resist region of the resist film that has undergone a change in thickness and a surface of an unexposed resist region of the resist film the thickness of which has remained unchanged, is detected to measure a position difference between a reference position for the reference pattern and a reference position for the resist pattern. This system comprises:

- a first position detector for illuminating the resist pattern with light to detect both a beam of reflection light reflected by the exposed resist region surface and a beam of reflection light reflected by the unexposed resist region surface so as to detect the reference position of the resist pattern;
- a second position detector for illuminating, through the resist film, the reference pattern to detect both a beam of reflection light reflected by a surface of the recess portion and a beam of reflection light reflected by a surface of the projection portion so as to detect the reference position of the reference pattern.

As a result of such arrangement, a measurement system, which is capable of position detection according to, for example, the light reflection characteristics of the reference pattern and the resist pattern, is accomplished. For example, since the reference pattern can be in the form of a grating pattern of recess and projection portions with a great surface level difference therebetween, this can produce a great amount of surface level difference signal from an interference pattern by beams of light reflected by the reference pattern. However, it is necessary to detect an interference pattern by light which has passed through the resist film twice, i.e., at the time when it enters the resist film and at the time when reflected by the pattern, so that the surface level difference signal is easily influenced and changed by the interference due to light reflected by the surface of the resist film. Although resist pattern detection requires only detection of light reflected by the surface of the resist film, the amount of surface level difference signal is small thereby requiring very high sensibility because the resist film undergoes less thickness variation. It becomes possible to change sensibility by detecting the position of the reference pattern and the position of the resist pattern with separate position detectors, thereby enabling accurate reference-position detection.

It is preferred that the first position detector includes a first light source which emits two coherent-light beams, and wherein the second position detector includes a second light source which emits light with a wide spectrum.

As described above, the reference position of the resist pattern with a small surface level difference is determined by the first position detector that makes use of two coherent-light beams. On the other hand, the reference position of the reference pattern with a great surface level difference is determined by the second position detector that makes use of white light with a wide spectrum. Such arrangement prevents reference-position maldetection caused by multiple reflection interference light the form of which is likely to be disturbed above the recess and projection portions of the reference pattern.

It is preferred that the first position detector and the second position detector share a single optical system.

It is preferred that the first and second position detectors have:

- a beam-splitter for receiving both light from the first light source and light from the second light source for transmission towards the wafer, and for receiving reflection light reflected by the wafer for transmission in directions other than the directions of the light sources;
- a first lens for collecting light beams from the beam-splitter on the wafer;
- a second lens for collecting beams of reflection light through the beam-splitter at each detector.

Such arrangement simplifies the structure of measurement system, in other words a measurement system, reduced in size, is achieved. The cost of production is reduced as well.

The present invention provides a resist-pattern measurement system wherein a resist film, formed on a wafer having a reference pattern, is exposed to light through a mask having a pre-determined pattern, to form a resist pattern, and wherein a surface level difference, defined by the exposure between a surface of an exposed resist region of the resist film that has undergone a change in thickness and a surface of an unexposed resist region of the resist film the thickness of which has remained unchanged, is detected to measure a position difference between a reference position for the reference pattern and a reference position for the resist pattern. This system comprises:

- a first light source which emits two coherent-light beams, and a second light source which emits light with a wide spectrum and the light axis of which is the same as the first light source;
- a rotation disk with a great number of radially extending slits which is placed within a plane between each light source and the wafer and perpendicular to the light axis;
- a first photodetector which detects an interference pattern produced by two coherent-light beams which are reflection light beams reflected, after having passed through the slits of the rotation disk, by the resist pattern;
- a second photodetector which detects a moire image produced by light beams with a wide spectrum which are reflection light beams reflected, after having passes through the slits of the rotation disk, by the reference pattern;
- wherein the amount of position difference between the reference position of the reference pattern and the reference position of the resist pattern is detected from a phase difference between the interference pattern and the moire image.

In accordance with the above arrangement, a position difference between a reference position for the reference pattern and a reference position for the resist pattern is detected from a phase difference between interference patterns, so that a high position detection accuracy can be obtained even when the intensity of light reflected by each pattern is low.

The present invention provides a resist-pattern measurement system wherein a resist film, formed on a wafer having a reference pattern, is exposed to light through a mask having a pre-determined pattern, to form a resist pattern, and wherein a surface level difference, defined by the exposure between a surface of an exposed resist region of the resist film that has undergone a change in thickness and a surface of an unexposed resist region of the resist film the thickness of which has remained unchanged, is detected to measure a position difference between a reference position for the reference pattern and a reference position for the resist pattern. This system comprises:

- a light source which emits light with a wide spectrum;
- an optical system which directs light from the light source towards the resist pattern and towards the reference pattern, and which directs both reflection light reflected by the resist pattern and reflection light reflected by the reference pattern in directions other than the direction of the light source;
- a photodetector which detects a regenerative image produced by beams of reflection light reflected, via the optical system, by the resist pattern and by the reference pattern;

transmission characteristic switch means which, on the one hand, allows only high-order diffracted light beams of all the reflection light beams reflected by the resist pattern to travel towards the photodetector, and which, on the other hand, allows only low-order diffracted light beams of all the reflection light beams reflected by the reference pattern towards the photodetector.

As a result of such arrangement, the reference position of the reference pattern having a great amount of surface level difference signal is detected in a stable manner through zero-order diffracted light, with the sensibility lowered, while on the other hand the reference position of the resist pattern having a small amount of surface level difference signal is detected through high-order diffracted light, with the sensibility increased. This constitutes an exposure tool having a simple structure capable of accurately detecting a reference position for each pattern.

The present invention provides a resist-pattern measurement system wherein a resist film, formed on a wafer having a reference pattern of recess portions and projection portions, is exposed to light through a mask having a pre-determined pattern, to form a resist pattern, and wherein a surface level difference, defined by the exposure between a surface of an exposed resist region of the resist film that has undergone a change in thickness and a surface of an unexposed resist region of the resist film the thickness of which has remained unchanged, is detected to measure a position difference between a reference position for the reference pattern and a reference position for the resist pattern. This system comprises:

- a light source which emits light with a wide spectrum;
- a first beam-splitter which reflects light emitted from the light source for transmission towards the wafer, and which directs reflection light reflected from the wafer in directions other than the direction of the light source;
- an objective lens which lies between the first beam-splitter and the wafer;
- a second beam-splitter which reflects part of light incident upon the objective lens;
- a reference mirror which reflects reflection light reflected by the second beam-splitter;
- a photodetector which detects not only an interference pattern produced by reflection light reflected by the reference mirror and reflection light reflected by the exposed and unexposed resist region surfaces, but also an interference pattern produced by reflection light reflected by the reference mirror and reflection light reflected by surfaces of the recess and projection portions;
- a scanner which shifts the wafer in its height direction for scanning;
- wherein a variation with time in the intensity of interference light at each interference pattern is detected while the wafer is being scanned in its height direction by the scanner, to detect, from a position at which the interference-light intensity becomes maximum, both the reference position of the reference pattern and the reference position of the resist pattern.

In accordance with the above arrangement, beams of light with a wide spectrum are used so that, while preventing the occurrence of maldetection of the reference position of the reference pattern due to light reflection from the resist pattern, the reference position of the resist pattern is detected by making use of interference of light reflected by the resist pattern and light reflected by the reference mirror, with high sensibility. Accordingly high-accuracy position difference amount detection can be accomplished by a simple structure.

BRIEF DESCRIPTION OF THE DRAWINGS

FIG. 1 is a flow diagram showing a procedure of correcting the amount of overlay difference during resist processing in accordance with a first embodiment of the present invention.

FIGS. 13(a), 13(b), and 13(c) are cross-sections depicting changes in a part of a resist film during resist processing in a fourth embodiment of the present invention.

FIG. 20 is a flow diagram showing a procedure of correcting the amount of overlay difference in accordance with a prior art technique.

FIG. 21 is a diagram useful in understanding factors for overlay error correction.

FIGS. 22(a), 22(b), 22(c), and 22(d) are cross-sections depicting changes in a part of a resist film during conventional resist processing in which exposure is carried out successively so as to form an alignment mark and an overlay pattern.

DETAILED DESCRIPTION OF THE INVENTION

Preferred embodiments of this invention are now described in detail with reference to the accompanying drawing figures.

EMBODIMENT 1

A first embodiment of the present invention is illustrated with reference to FIGS. 1 to 9.

Figure 3:
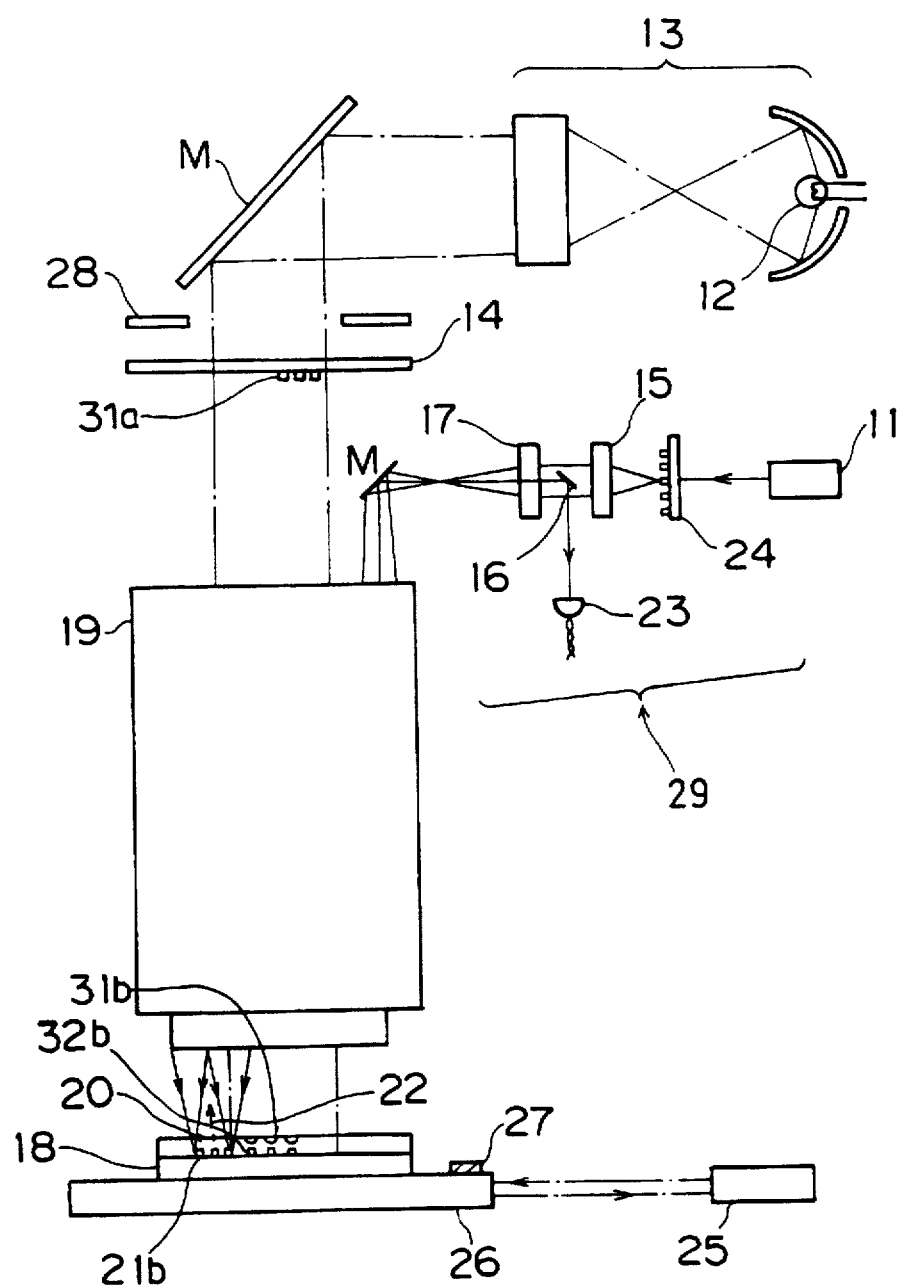
FIG. 3 is a schematic sideview of an exposure tool in accordance with the first embodiment.

As shown in FIG. 3, arranged in front of an exposure light source 12 are an illumination optical system 13, a mirror M, a mask blind 28, and a mask 14. On the other hand, arranged in front of a measurement light source 11 is an alignment optical system 29. The system 29 is made up of an alignment grating 24 which is a reference for alignment, a first lens system 15, a spacial filter 16, a second lens system 17, a photodetector 23, and a mirror M. The alignment optical system 29 serves also as an optical system capable of measuring the amount of position difference. Additionally, placed in front of these two optical systems 13 and 29 is a reduction optical system 19. Arranged underneath the reduction optical system 19 is a wafer stage 26 onto which a semiconductor wafer 18 is placed. It is so designed that the position of the wafer stage 26 is detected by means of a laser interferometer 25. A target 27 used for stage fixation is formed on the wafer stage 26.

Figure 4A:
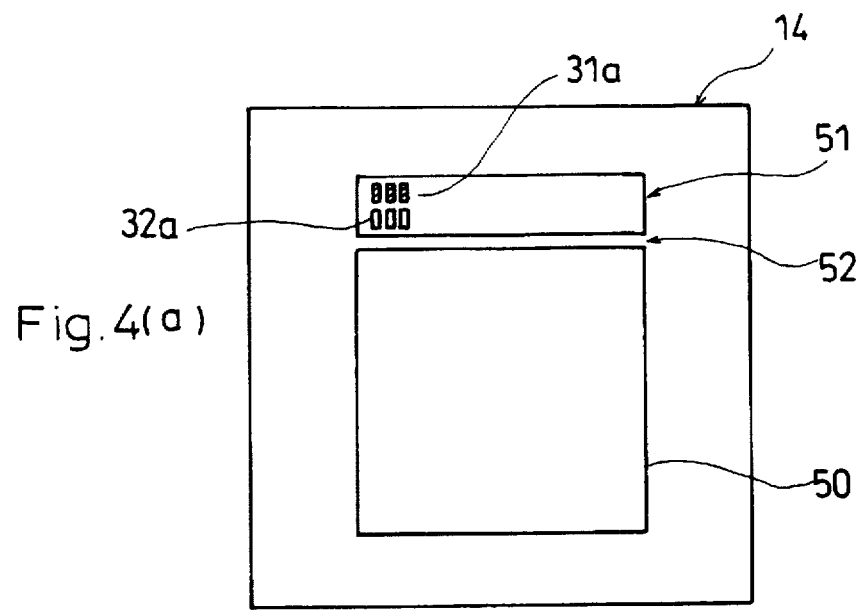
FIG. 4(a) is a plan illustrating the structure of a mask pattern for use in each embodiment of the present invention and FIG. 4(b) outlines the structure of a chip section of a wafer.
Figure 4B:
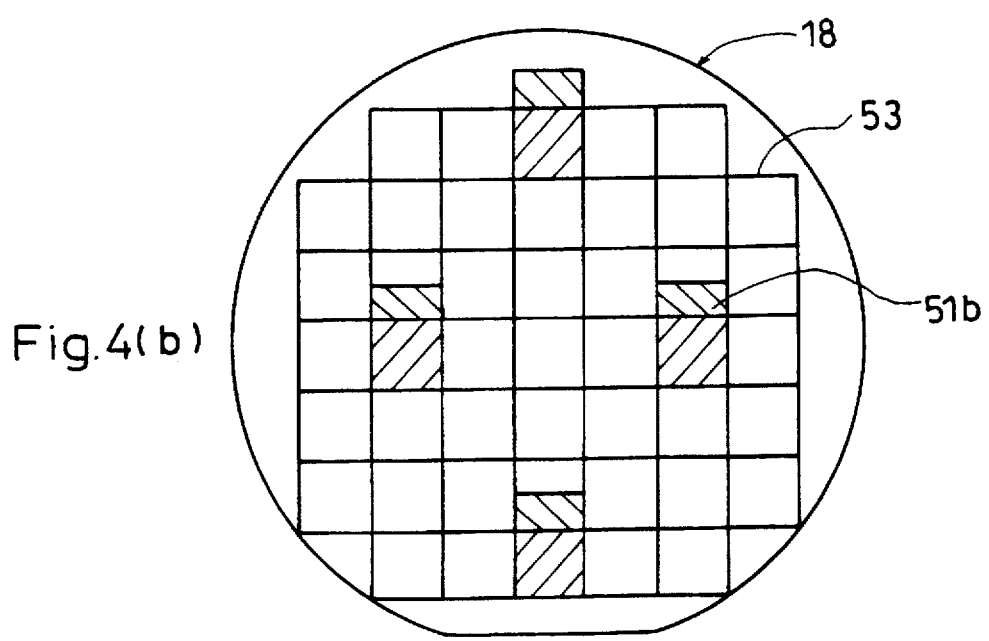

As shown in FIG. 4(a), the mask 14 has a circuit pattern zone 50 having an overlay reference (OR) pattern 32a and an overlay measurement (OM) pattern 31a, and an overlay measurement zone 51. The zones 50 and 51 are separated from each other by a shading zone 52. The mask blind 28 is used for selectively exposing either one of the zone 50 and the zone 51. An alignment mark is formed within a scribe line zone 53 located in or in the perimeter of the zone 50. As shown in FIG. 4(b), an image of the zone 51 is transferred by exposure processing onto two or more chips of the wafer 18. Both the OR pattern and the OM pattern are placed over the scribe line zone 53 in order that a maximum number of usable chips is obtained from the wafer 18.

Referring now to FIGS. 1–9, a procedure of measurement and correction of the amount of overlay difference is explained.

In step ST1, a resist is applied onto the surface of the semiconductor wafer 18 to form a resist film 33. Subsequently, the wafer 18 is placed on the wafer stage 26 of the exposure tool. Note that an alignment mark 21b and an OR pattern 32b are already formed on the wafer 18 before application of the resist film 33. The alignment optical system 29 is used to determine the amount of position difference between the alignment mark 21b and the alignment grating 24, and the semiconductor wafer 18 is shifted, with the aid of the laser interferometer 25, by a proportional distance to the determined position difference amount, to be guided to an exposure position.

Figure 2A:
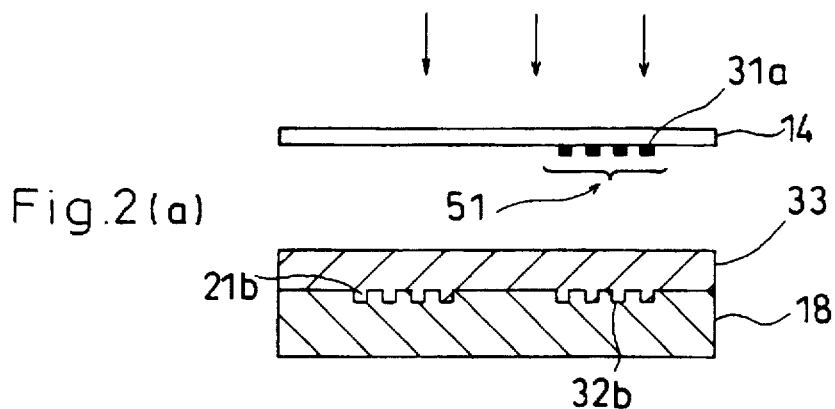
FIG. 2, composed of 2(a), 2(b), and 2(c), schematically depicts cross-sections and a top plan view of patterns at different steps of the overlay difference amount correction procedure of the first embodiment.
Figure 2B:
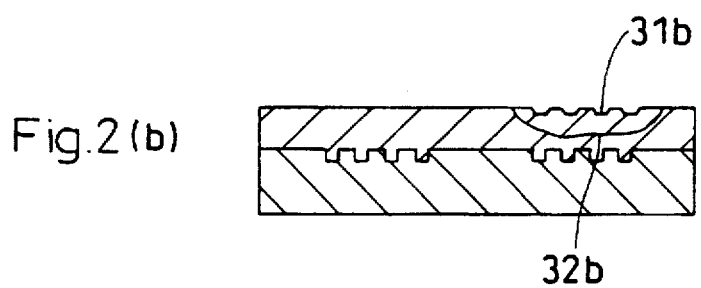
Figure 5:
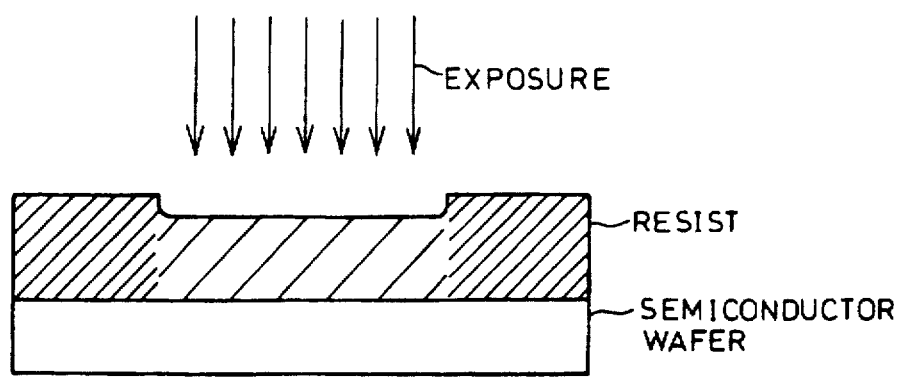
FIG. 5 illustrates a surface level difference (SLD) which becomes manifest as a result of exposing a resist film to beams of light.

In step ST2, as shown in FIG. 2(a), the resist film 33 is selectively illuminated, through the mask 14, with beams of light from the optical system 13. At this time, the mask blind 28 of FIG. 3 (not shown in FIG. 2(a)) is used so that the light beams pass through only the zone 51, in other words the resist film 33 is patterned according to the OM pattern 31a. More specifically, as shown in FIG. 2(b), the exposed resist film 33 undergoes a change in the film thickness, whereupon an OM pattern 31b is formed in the resist film 33. FIG. 5 shows that a resist film undergoes loss in thickness upon exposure to light. As shown in FIG. 5, an exposed region of the resist film is reduced in thickness thereby forming a recess portion.

Figure 2C:
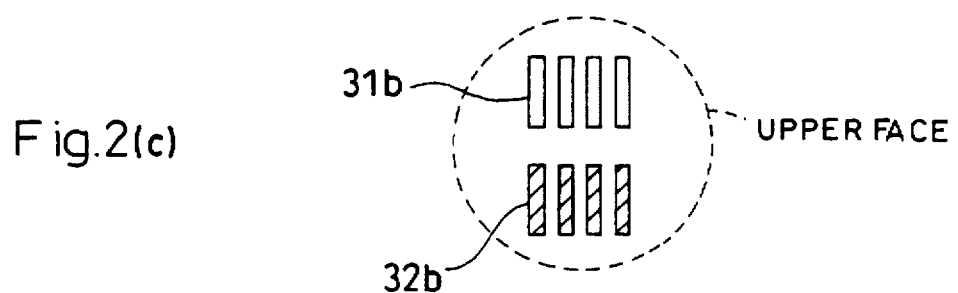

As shown in FIG. 2(c), the OR pattern 32b and the OM pattern 31b are formed such that they are located next to each other on a plane surface. FIG. 2(c) shows in cross section the OR pattern 32b and the OM pattern 31b in which they are made to appear to be cut at the same section for convenience sake. These patterns 32b and 31b are actually at different cross-sections.

Next, in step ST3, a means, which is capable of measuring an overlay difference amount and which is arranged within the reduction projection optical system 19, is used. This means detects a reference position for the OM pattern 31b, and a reference position for the OR pattern 32b. A difference between the two reference positions serves as an overlay difference amount (the principle of measuring an overlay difference amount is explained later). Subsequently, based on information as to the overlay difference amount, factors that contribute to overlay errors (e.g., offset, wafer scaling, chip magnification, and orthogonality) are corrected in order to reduce the overlay difference to a minimum.

In step ST4, every wafer to be processed actually is subjected to exposure processing wherein the mask blind 28 is used to mask the zone 51 so that beams of exposure light pass through only the zone 50, and then to development processing.

Figure 8:
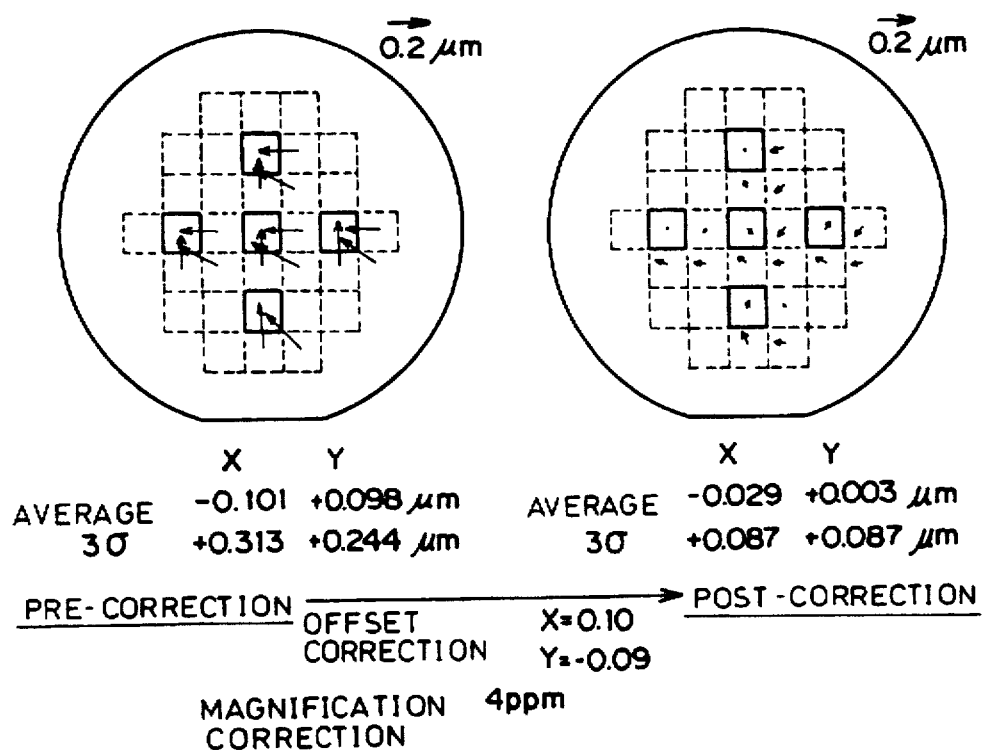
FIG. 8 shows pre-correction overlay difference distribution and post-correction overlay difference distribution.

Finally, in step ST5, the accuracy of overlay is determined. FIG. 8 shows pre-correction overlay difference distribution and post-correction overlay difference distribution. It is to be noted that the amount of offset correction at the time of performing correction processing is 0.10 μm in the "x" direction, and −0.09 μm in the "y" direction.

FIG. 8 shows that the present embodiment achieves an overlay difference amount of 0.1 μm or less.

Figure 6:
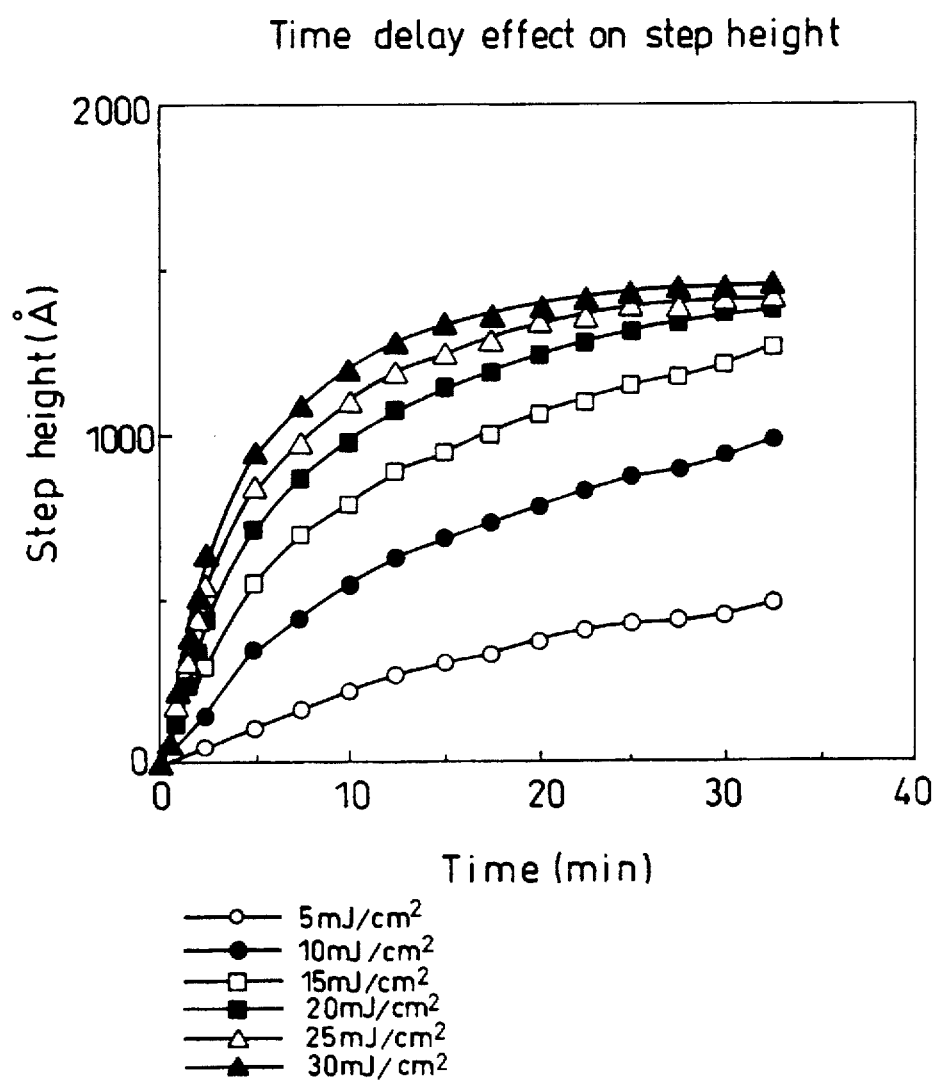
FIG. 6 is a graph showing SLD variations with time for various exposure doses.

For example, as shown in FIG. 6, chemically amplified resists are characterized in that they, when exposed to light, undergo thickness variation depending on the exposure dose and on the time elapsed. Of two-component chemically amplified resists composed of (i) a derivative of polyvinyl phenol with protecting groups capable of preventing dissolution in alkaline solution and (ii) an acid generator, a polymer which is expressed by the following formula (1) is characterized in that it has protecting groups that are released through the action of weak acid so that the process of post-exposure film loss is completed within 2–3 minutes at room temperature. This makes it possible to determine the amount of overlay difference immediately exposure processing for pattern transfer is finished. This provides the advantage that the overlay difference amount can be measured with no drop in throughput. The formula (1) shows a chemically amplified resist that is a polymer formed of (i) a monomeric unit having functional groups which become soluble in aqueous alkali and (ii) a monomeric unit having phenolic hydroxyl groups.

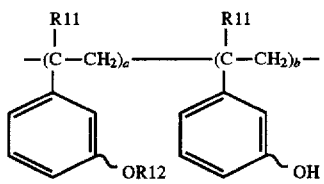

(1)

where R11 is either an atom of hydrogen or a methyl group while R12 is a group which has the following formula (2) and which is selected among —$CH_2COOR_{19}$ groups, tert-butoxycarbonyl groups, tetrahydroxypyranyl groups, and trimethylsilyl groups.

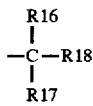

(2)

where:
(i) R16 and R17 each indicate either an atom of hydrogen, or an alkyl group having either a linear chain form or a branching form where the number of atoms of carbon contained therein falls in the range of one to three;
(ii) R18 indicates either an alkyl group having either a linear chain form, or a branching form, or a cycle form where the number of atoms of carbon contained therein falls in the range of one to six, or an alkoxy group having either a branching form or a cycle form where the number of atoms of carbon contained therein falls in the range of one to six;
(iii) R19 is either an alkyl group having a linear line form or a cycle form where the number of atoms of carbon contained therein falls in the range of one to six, or an alkoxy alkyl group having a branching form or a cycle form where the number of atoms of carbon contained therein falls in the range of three to eight.

The aforesaid protecting groups of the formula (2) can be released more easily through the action of acid in comparison with other protecting groups such as the tertbutyl group. In other words, the formula (2) protecting groups are released rapidly after exposure processing and the process of film loss occurs. FIG. 6 is a graph showing SLD (surface level difference) variations with time for various exposure doses. When a great exposure dose is used, an SLD of about 0.5 μm is created in about 2–3 minutes. In the present embodiment, a two-component chemically amplified resist is used. A three-component chemically amplified resist may be used with the same effect.

Figure 7:
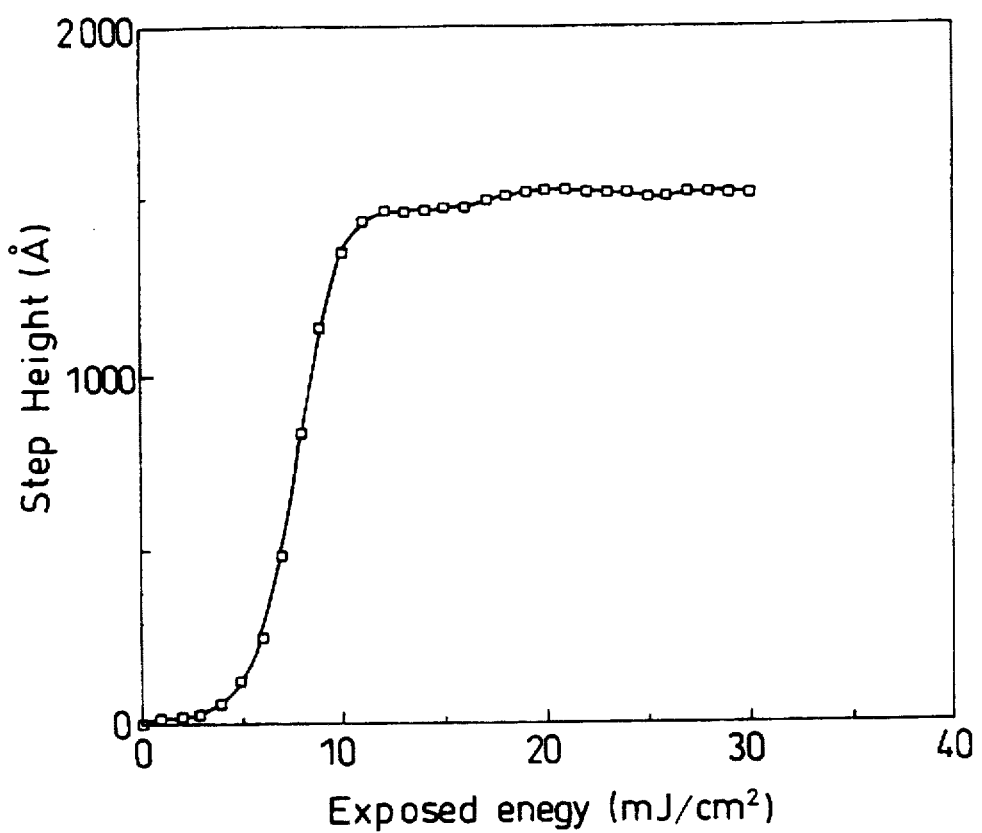
FIG. 7 is a graph showing the dependance of the SLD upon the exposure dose.

FIG. 7 is a graph showing the dependance of the SLD upon the exposure dose. When the exposure light intensity exceeds 10 mJ/cm², the SLD undergoes a sudden increase.

Figure 9A:
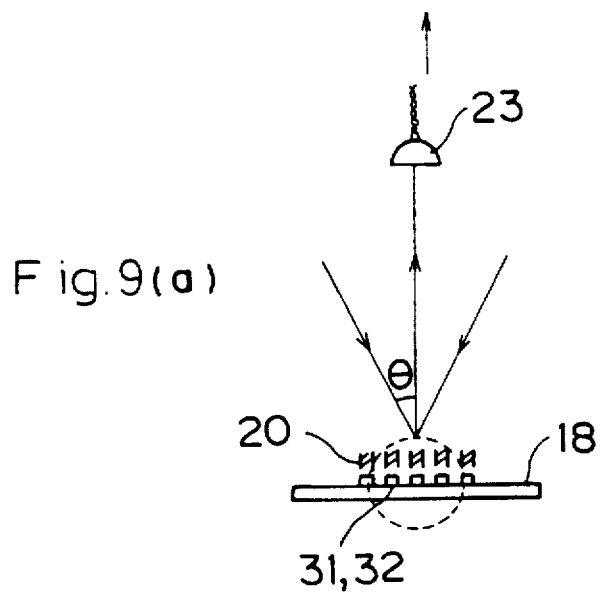
FIGS. 9(a), 9(b), and 9(c) are diagrams useful in understanding the principle of detecting the amount of position difference in accordance with the first embodiment.
Figure 9B:
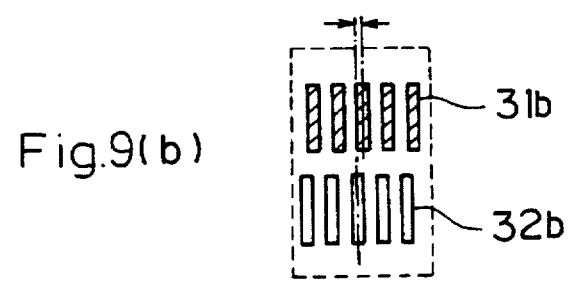
Figure 9C:
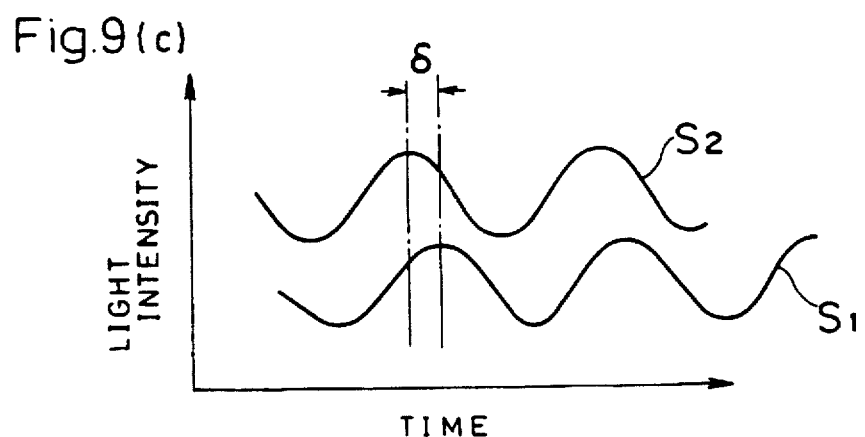

Referring now to FIGS. 9(a)–9(c), a way of measuring an overlay difference amount, which is employed in the present embodiment, is demonstrated. In the present embodiment, the above-described optical systems (see FIG. 3) are used and the amount of overlay difference is measured by means of a two-beam interference method. It is arranged such that coherent-light beams U1 and U2 of nearly the same frequency, strike on the resist film 33 overlying the semiconductor wafer 18, with an angle of incidence of θ (see FIG. 9(a)). As a result, interference fringes 20 are formed which serve as an overlay measurement reference for the OM pattern 31b and for the OR pattern 32b. The pitch of the interference fringes 20, P, is given by the equation (1).

$$P = \lambda/(2 \sin \theta) \quad (1)$$

where λ is the wavelength of incident light. The OM pattern 31b, the pitch of which is an integral multiple of the pitch P of the interference fringes 20, and the OR pattern 32b are formed (see FIG. 9(b)). As indicated in FIG. 9(a), at the same time, each of the OR pattern 32b and the OM pattern 31b is illuminated with the light beam U1 and the light beam U2. Light diffracted by the OM pattern 31b and light diffracted by the OR pattern 32b are detected by the photodetector 23 to measure the amount of overlay difference between the patterns. More specifically, U(f1), which is the intensity of a light beam of the ± primary light (U1) that is diffracted in a direction perpendicular to the wafer 18 by the OR (OM) pattern 32b (31b), is given by the equation (2), while on the other hand, U(f2), which is the intensity of a light beam of the ± primary light (U2) that is diffracted in a direction perpendicular to the wafer 18 by the OR (OM) pattern 32b (31b), is given by the equation (3).

$$U(f1)=A(f1)\cdot\exp\{i\,(2f1\cdot t-\delta)\} \quad (2)$$

$$U(f2)=A(f2)\cdot\exp\{i\,(2f2\cdot t-\delta)\} \quad (3)$$

where δ is the phase difference based on the position difference between the two-beam interference fringes and the OR pattern 32b, and based on the position difference between the two-beam interference fringes and the OM pattern 31b. Such differences are given by:

$$\delta 1 = 2\pi \cdot x1 \cdot \sin\theta/\lambda$$

$$\delta 2 = 2\pi \cdot x2 \cdot \sin\theta/\lambda$$

From these equations, the intensities of diffracted light beams of the ± primary light are given by the equations (4) and (5).

$$\begin{aligned}
I1 &= |U(f1) + U(f2)|^2 \\
&= A(f1)^2 + B(f2)^2 + 2A(f1)\cdot B(f2) \cdot \cos\{2\pi(f1-f2)t - 2\delta1\} \\
&= A(f1)^2 + B(f2)^2 + 2A(f1)\cdot B(f2) \cdot \cos\{2\pi(f1-f2)t - 2x1/P\}
\end{aligned} \quad (4)$$

$$\begin{aligned}
I2 &= A(f1)^2 + B(f2)^2 + 2A(f1)\cdot B(f2) \cdot \cos\{2\pi(f1-f2)t - 2\delta2\} \\
&= A(f1)^2 + B(f2)^2 + 2A(f1)\cdot B(f2) \cdot \cos\{2\pi(f1-f2)t - 2x2/P\}
\end{aligned} \quad (5)$$

where I1 is the intensity of an interference light beam of diffracted light from the OR pattern 32b while I2 is the intensity of an interference light beam of diffracted light from the OM pattern 31b.

The equation (4) contains "x1" (i.e., the amount of position difference between the interference fringes 20 and the OM pattern 31b) in the phase term for a beat signal detected by the photodetector 23 and likewise the equation (5) contains "x2" (i.e., the amount of position difference between the interference fringes 20 and the OR pattern 32b) in the phase term for a beat signal detected by the photodetector 23. As illustrated by FIG. 9(c), the photodetector 23 detects a heterodyne beat signal S1 diffracted from the OR pattern 32b and a heterodyne beat signal S2 diffracted from the OM pattern 31b. Subsequently, a phase meter is used to measure a phase difference, δ (=δ1−δ2), between the heterodyne signals S1 and S2, thereby enabling measurement of the amount of overlay difference between the semiconductor circuit patterns that overlap.

In the present embodiment, the position of the OM pattern 31b that is a grating-like pattern is detected by means of a two-beam interference method. As a result of such arrangement, even if the exposed resist film 33 (i.e., the OM pattern 31b) does not undergo much film loss, high-accuracy overlay measurement still can be achieved.

In the present embodiment, the alignment optical system serves also as an overlay optical system. Separate optical systems for alignment and overlay, respectively, may be employed with the same effect as the present embodiment. Additionally, in the present embodiment, the overlay difference amount is determined by means of phase difference detection; however, the overlay difference amount may be measured by means of image recognition.

In the present embodiment, the chemically amplified resists having the formulas (1) and (2) are used. Any other functionally equivalent chemically amplified resists may be useful. For example, the formula (3) shows an example of such chemically amplified resists, i.e., a system that is composed of (i) a polymer (PBOCST: p-tertbutoxycarbonyloxystyrene) in which OH groups of polyhydroxystyrene (PHS) are protected by tertbutoxycarbonyl groups (t-BOC) and (ii) an onium salt that is an acid generator.

(PBOCST)

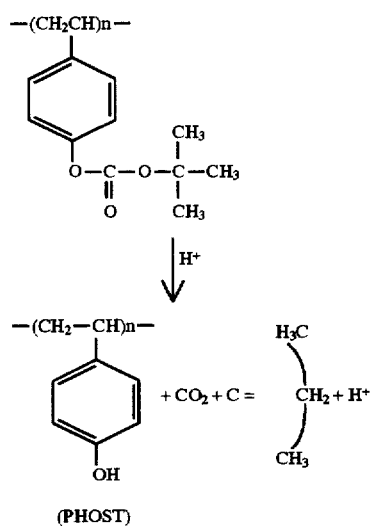

(PHOST)

Onium salt such as iodonium salt, which is known as a cationic photopolymerization initiator, generates a strong proton acid upon exposure to light. When amino acid protecting groups and butoxycarbonyl groups (t-BOC) are acid-processed, they generate isobutene and $CO_2$ to undergo dissociation. When a system of PBOST and onium salt is illuminated with light, proton acid is generated by such illumination and decomposes t-BOC groups to generate poly(p-hydroxy styrene) (PHOST), isobutene, and $CO_2$. Such isobutene, which is a gaseous matter, is discharged to outside the system, together with the $CO_2$, and only the PHOST is left within the system. In other words, the exposed resist film stands further back than the unexposed resist film or undergoes film loss, thereby forming a recess portion.

Further, a system having the formula (4) may be used.

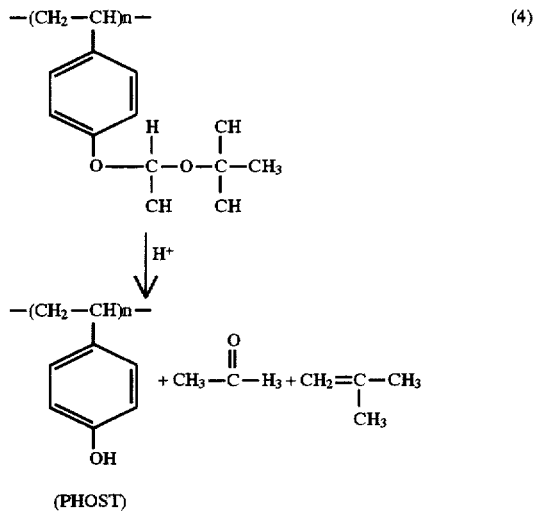

(PHOST)

The system of the formula (4) is composed of a polymer formed of poly(p-tert-butoxy-methoxy) and onium salt such as iodonium salt. When the system is exposed to light, proton acid is generated by such illumination and decomposes tert-butoxy-methoxy groups to generate PHOST, isobutene, and aldehyde. Such isobutene and aldehyde become gaseous and are discharged to outside the system, and only the PHOST lingers and is left within the system. As a result, film loss occurs.

In the present embodiment, the resist film is just left after exposure processing to wait for the occurrence of film loss. A post-exposure bake (PEB) may be carried out to foster reactions such as decomposition for the speedy process of film loss (i.e., change in the film thickness).

EMBODIMENT 2

A second embodiment of this invention, in which a means for detecting the position of an OM (overlay measurement) pattern is provided independently of a means for detecting the position of an OR (overlay reference) pattern, is described.

Figure 10:
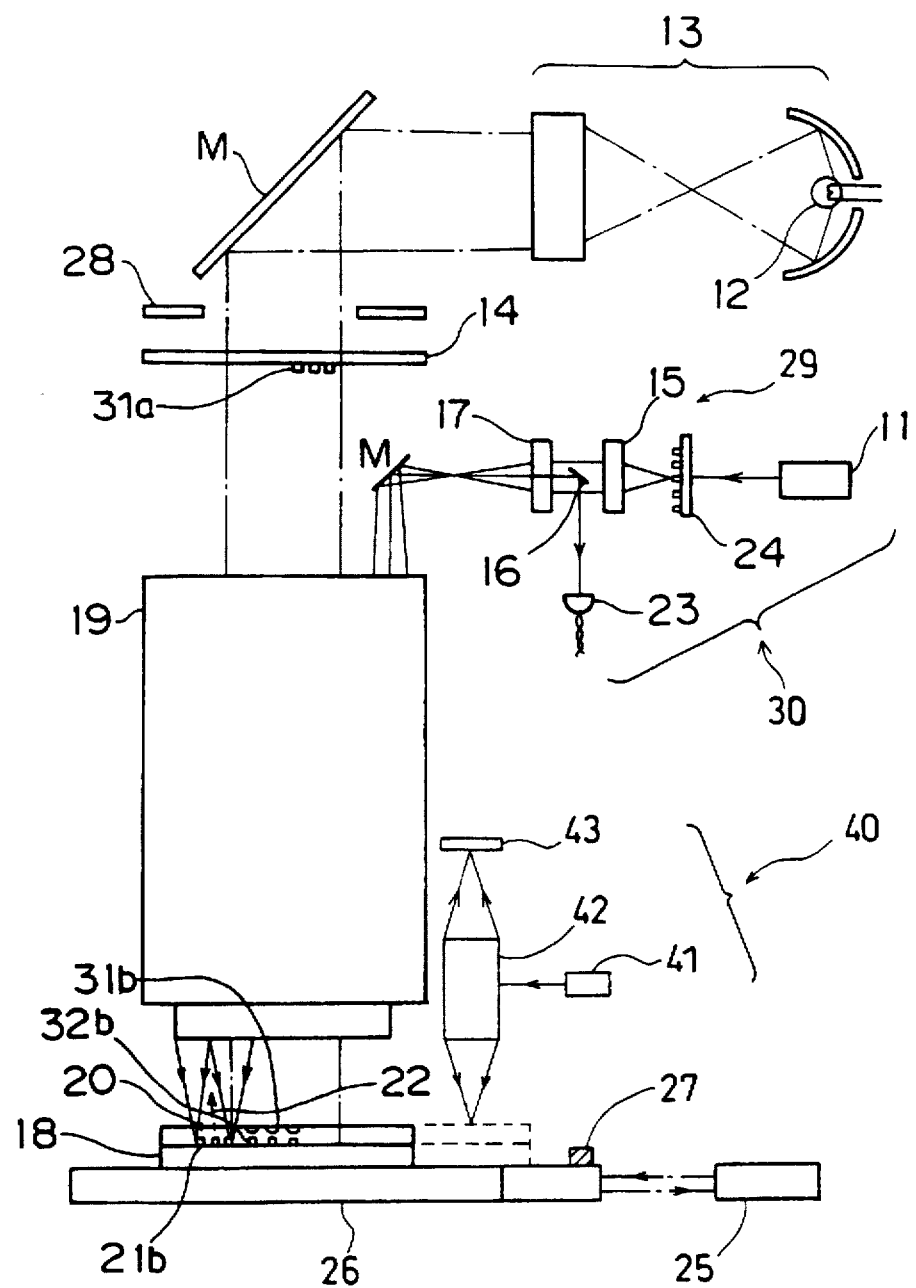
FIG. 10 is a schematic sideview of an exposure tool in accordance with a second embodiment of the present invention.

Referring now to FIG. 10, the structure of the second embodiment is illustrated. An illumination optical system 13, a mirror M, a mask blind 28, and a mask 14 are all arranged in front of an exposure light source 12. An alignment grating 24 serving as an alignment reference pattern, a first lens system 15, a spacial filter 16, a second lens system 17, and a mirror M together form an alignment optical system 29 in front of a measurement light source 11 that emits coherent light. Additionally, a first photodetector 23 is provided which is capable of detecting the intensity of light reflected off the semiconductor wafer. The alignment optical system 29 acts also as an optical system for detecting the position of the OM pattern. Arranged in front of the optical systems 13, 29 is a reduction optical system 19. The light source 11, the alignment optical system 29, and the first photodetector 23 together constitute a first position detector 30.

In addition to the above components, a second position detector 40 for detecting the position of the OR pattern is

17 provided. The second position detector 40 is formed of these components: a white light source 41 which emits beams of white light with a wide spectrum; a reference pattern detection optical system 42 acting as a second optical system which not only directs light from the light source 41 in the direction of the wafer 18 but also transmits light reflected by the wafer 18 in a direction other than the direction of the light source 41; and a second photodetector 43 which detects the intensity of reflection light from the optical system 42 by means of image recognition.

A wafer stage 26, onto which the wafer 18 is placed, lies below the optical systems 19, 42. It is so designed that the position of the wafer stage 26 is detected by means of a laser interferometer 25. A target 27 for stage fixation is provided on the wafer stage 26.

In the present embodiment, the amount of position difference between OM and OR is determined in basically the same procedure as the first embodiment (see FIG. 1). The present embodiment, however, differs from the first embodiment as follows. In step ST3 of the present embodiment, the position of an OM pattern, which is transferred to the resist film 33 where it becomes manifest, is detected by the first position detector 30 which utilizes a coherent light source while on the other hand the position of an OR pattern is detected by the second position detector 40 which utilizes a white light source.

Also in the present embodiment, chemically amplified resists identical with the ones of the first embodiment are used.

The principle of measuring the amount of overlay difference that the present embodiment uses is explained. The optical systems of FIG. 10 are employed in the present embodiment, and the principle of the present embodiment is basically the same as FIGS. 9(a)–(c). It is arranged such that coherent-light beams U1 and U2 of nearly the same frequency, strike on the resist film 33 formed on the semiconductor wafer 18, with an angle of incidence of θ (see FIG. 9(a)). As a result, interference fringes 20 are formed which serve as an overlay measurement reference for the OM pattern 31b and for the OR pattern 32b. The pitch of the interference fringes 20, P, is given by the equation (1).

$$P = \lambda/(2 \sin \theta) \quad (1)$$

where λ is the wavelength of incident light. The OM pattern 31b, the pitch of which is an integral multiple of the pitch P of the interference fringes 20, is formed (see FIG. 9(b)). As indicated in FIG. 9(a), at the same time, the OM pattern 31b is illuminated with the light beam U1 and the light beam U2. Light diffracted by the OM pattern 31b is detected by the photodetector 23. U(f1), which is the intensity of a light beam of the ± primary light (U1) that is diffracted in a direction perpendicular to the wafer 18 by the OM pattern 31b, is given by the equation (2), while on the other hand, U(f2), which is the intensity of a light beam of the ± primary light (U2) that is diffracted in a direction perpendicular to the wafer 18 by the OM pattern 31b, is given by the equation (3).

$$U(f1) = A(f1) \cdot \exp\{i(2\pi f1 \cdot t + \delta)\} \quad (2)$$

$$U(f2) = A(f2) \cdot \exp\{i(2\pi f2 \cdot t + \delta)\} \quad (3)$$

where δ is the phase difference based on the position difference between the two-beam interference fringes and the OM pattern 31b. Such difference is given by:

$$\delta = 2\pi \cdot x1 \cdot \sin \theta/\lambda$$

From this equation, the intensity of the diffracted light of the ± primary light is given by the equation (4).

18

$$\begin{aligned} I1 &= |U(f1) + U(f2)|^2 \quad (4)\\ &= A(f1)^2 + B(f2)^2 + 2A(f1) \cdot B(f2) \cdot \cos\{2\pi(f1-f2)t - 2\delta1\}\\ &= A(f1)^2 + B(f2)^2 + 2A(f1) \cdot B(f2) \cdot \cos\{2\pi(f1-f2)t - 2x1/P\} \end{aligned}$$

where I1 is the intensity of interference light of the diffracted light by the OM pattern 31b.

The equation (4) contains "x1" (i.e., the amount of relative position difference between the interference fringes 20 and the OM pattern 31b) in the phase term as to a beat signal detected by the photodetector 23. As can be seen from FIG. 9(c), the photodetector 23 detects a heterodyne beat signal S1 diffracted from the OM pattern 31b and a heterodyne beat signal S2 as a reference. Subsequently, while measuring, with a phase meter, a phase difference, δ1, between the heterodyne beat signals S1 and S2, the position of the wafer stage 26 is determined using a laser interferometer, for detecting the position of the OM pattern 31b. Since the present embodiment does not use two coherent-light beams for detecting the position of the OR pattern 32b, the heterodyne signal S2 is utilized instead. On the other hand, detection of the position of the OR pattern 32b is carried out using a solid-state image sensing device (i.e., an image recognition means) using a white-light source while at the same time a laser interferometer is used to measure the position of the wafer stage 26. Calculations are performed to measure a distance between the OM pattern 31b and the OR pattern 32b, and the difference between the distance thus calculated and a design position is the amount of position difference.

In the present embodiment, the position of the OM pattern 31b that is a grating-like pattern is detected by means of a two-beam interference method. As a result of such arrangement, even if the exposed resist film 33 (i.e., the OM pattern 31b) does not undergo sufficient film loss, high-accuracy overlay measurement still can be achieved.

In the present embodiment, the process of OR-pattern detection is carried out using white light, which provides the following effects.

Figure 11:
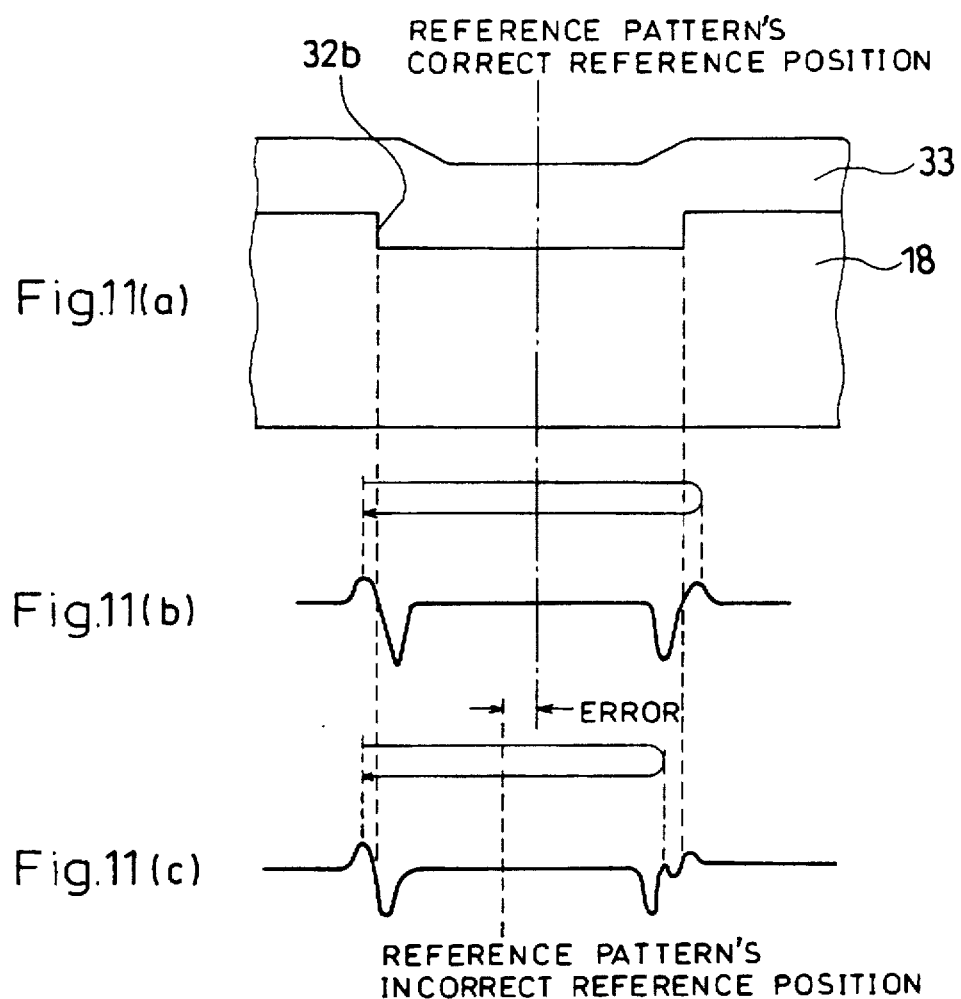
FIGS. 11(a), 11(b), and 11(c) are diagrams useful in understanding how detection errors of a reference position for a reference pattern, which are to be cancelled by a technique of measuring the amount of position difference of the second embodiment, occur.

When trying to perform accurate measurement of the OR and OM patterns with a common light source and a common optical system, this limits the type of light source, therefore resulting in use of a light source that emits coherent light. Referring now to FIG. 11(a), the resist film 33 is applied onto a pattern of recesses and projections in a grating arrangement (i.e., an OR pattern in the wafer 18). Intensity variation, caused by interference of beams of light reflected by points of the bottom of the recess/projection pattern, are shown in FIG. 11(b). When detecting a reference position for the OR pattern 32(b) (e.g., the bottom center of the pattern), a folding technique is employed. In the folding technique, a symmetrical interference pattern, which is defined between a left-hand peak and a right-hand peak in the figure, is folded to determine a central reference position. The amount of position difference between the position of the OR pattern 32b thus found and the position of the OM pattern 31b is obtained. When the OR pattern 32b is illuminated with light beams having the same wavelength and the same phase (i.e., coherent light beams) via the covered resist film 33 to detect its reference position, multiple reflection interference occurs in the resist film 33 by beams of light reflected from the step portion, as a result of which a light intensity variation pattern is detected as having a complicated shape. Because of this, a subpeak indicated on the right-hand side of FIG. 11(c) is wrongly sensed to be a true step peak, and a pattern formed between such a subpeak and the right-hand peak is folded in an overlap manner, and the center between the peaks is determined to be a reference position. Therefore, the reference position of the OR pattern 32b is determined in error. On the other hand, if both the position of the OR pattern 32b and the position of the OM pattern 31b are to be detected using white light with a wide spectrum, this degrades the accuracy of measurement of the amount of overlay difference, since the contrast between intensity variation of interference light reflected from the step portion of the OM pattern 31b and intensity variation of interference light from the OR pattern 32b is low. If such occurs in the first embodiment, the first embodiment may suffer maldetection of the amount of position difference.

Conversely, in accordance with the present embodiment, the OR pattern 32b is position-detected using white light, thereby reducing the effect of multiple reflection interference occurring in the resist film 33. High-accuracy position detection can be achieved. As a result of such arrangement, even if the OR pattern 32 is covered with a resist film, the difference in position between a step of the OM pattern 31b formed by exposure processing and the underlying OR pattern 32b can be measured at a high accuracy.

In the present embodiment, the alignment optical system serves also as an overlay optical system. Separate optical systems for alignment and overlay, respectively, may be employed with the same effect as the present embodiment. Additionally, in the present embodiment, the overlay difference amount is determined by means of phase difference detection; however, the overlay difference amount may be measured by means of image recognition.

EMBODIMENT 3

A third embodiment of the present invention is described with reference to FIGS. 12(a)–12(d).

The present embodiment employs the same method of measuring the amount of overlay difference and the same method of correcting the amount of overlay difference as the first embodiment. In addition, the present embodiment uses an exposure tool identical with the one used in the first embodiment. As described previously, the first embodiment shows an example in which protecting groups are utilized which are released through the action of acid generated by light illumination. In the present embodiment, the process of silylation is employed in which silicon is selectively introduced after exposure processing, and dry development is carried out using the introduced silicon as a mask, to form a resist pattern of negative type.

Figure 12A:
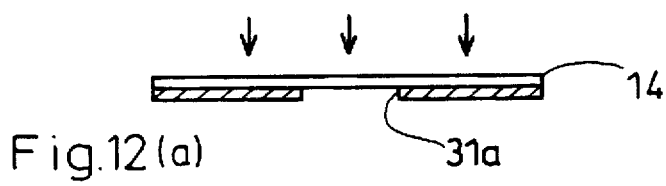
FIGS. 12(a), 12(b), 12(c), and 12(d) are cross-sections depicting changes in a part of a resist film during resist processing in a third embodiment of the present invention.
Figure 12B:
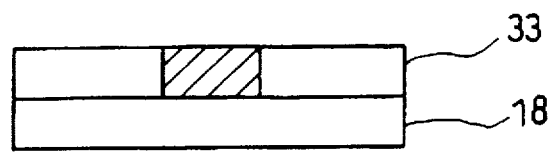
Figure 12C:
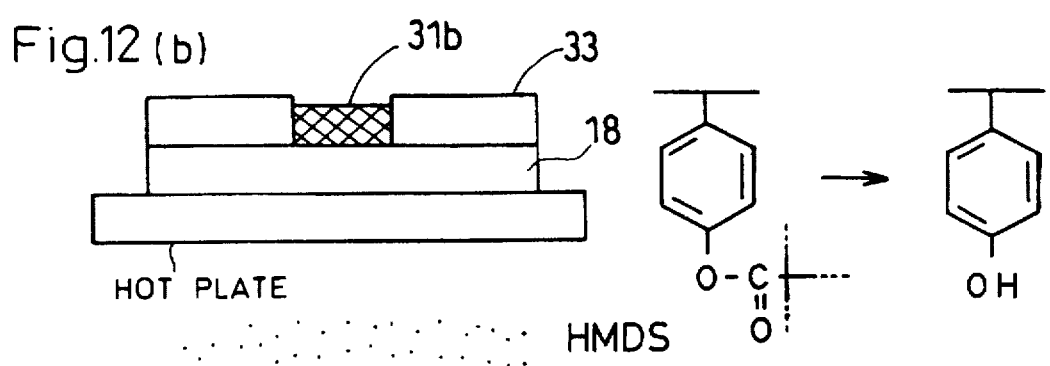
Figure 12D:
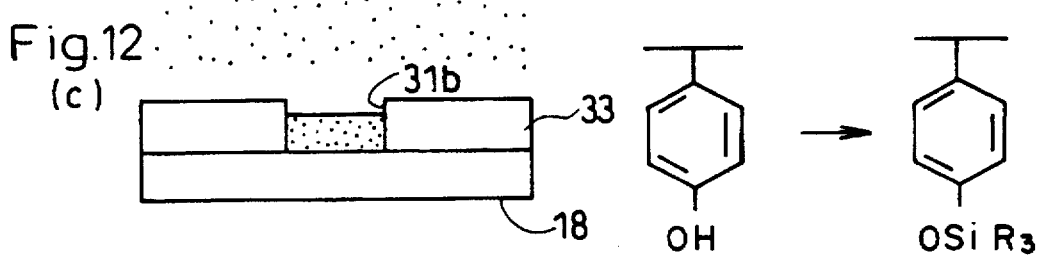

FIGS. 12(a), 12(b), 12(c), and 12(d) are cross-sections depicting changes in a part of a resist film during resist processing. As shown in FIG. 12(a), the resist film 33 on the wafer 18 is illuminated with light through the mask 14, whereupon a latent image of the OM pattern 31a of the mask 14 is formed in the resist film 33. In the present embodiment, PHOST is used as a material for forming a resist film, so that the chemical reaction of the formula (3) occurs promptly when the wafer 18 is post-expose backed, as shown in FIG. 12(b). As a result, the exposed region of the resist film 33 undergoes film loss, whereupon the OM pattern 31b is formed which stands further back than the unexposed resist film 33. Subsequently, as shown in FIG. 12(c), silylation is accomplished using, for example, hexamethyldisilazane (HMDS), as a result of which PHOST's hydroxyl groups are silylated thereby generating trimethylsilylether at the exposed resist film 33. This is followed by removal of the unexposed resist film 33 by means of an RIE process that employs $O_2$ gas, whereupon a negative-type pattern is formed.

The process of silylation is used in the present embodiment, which produces the advantage that, since the silylated region is not removed easily, this makes it possible to determine, for example, the amount of overlay difference without the need for performing resist development processing, by making use of a step created after exposure processing.

In the present embodiment, chemically amplified resists are used for the process of silylation. NOVOLAC resists or the like may be used.

The amount of overlay difference may be measured using a step formed after silylation processing, although the effect is somewhat degraded.

EMBODIMENT 4

A fourth embodiment of the present invention is described by making reference to FIGS. 13(a)–13(c).

The present embodiment is based on the following. UV light is used to illuminate a film of a resist material containing photoacid generator groups. Thereafter, a CVD process, in which the resist film is exposed to vapors of alkoxy silane, is carried out. This causes selective generation of polysiloxane in the vicinity of the surface of the exposed resist film, thereby defining a surface level difference (SLD).

A resist, which is synthesized by means of radical polymerization of a copolymer of NISS (1,2,3,4-tetrahydronaphthylideneamino-p-styrenesulfonate) and methyl methacrylate. This resist is applied by a spin-coat process onto the semiconductor wafer 18 to form the resist film 33 and subsequently 248-nm KrF excimer laser light is used to illuminate the resist film 33 through the mask 14 having the OM pattern 31a (see FIG. 13(a)). The resist film 33, which is formed of a polymer having an NISS unit at a side chain thereof, undergoes photodecomposition as a result of such illumination, to generate styrene sulfonic acid (see the formula (5)).

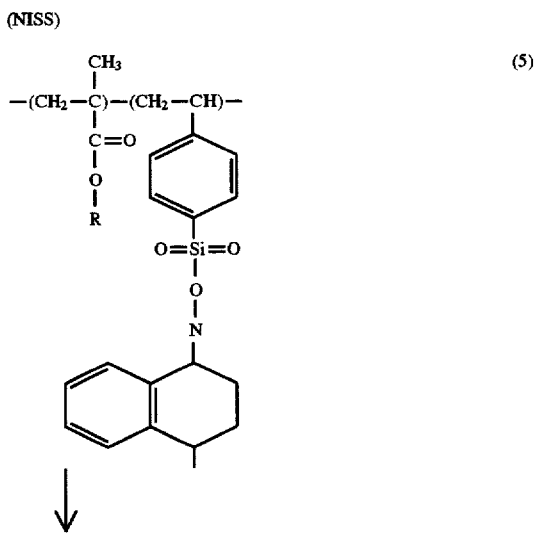

-continued

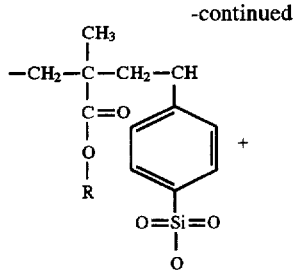

Because of such generated sulponic acid, the surface of the exposed resist film 33 becomes hydrophilic, therefore adsorbing water in the atmosphere (see FIG. 13(b)). Next, as shown in FIG. 13(c), a CVD process, in which the resist film 33 is exposed to a gas of nitrogen containing methoxy silane (MTXOS) at room pressure and in the air saturated with water vapor at 30 degrees centigrade, is carried out. As a result, the process of hydrolysis and then the process of polycondensation occur, whereupon polysiloxane is generated so that the film thickness of the resist film 33 increases, and the OM pattern 31b, which projects, is formed in the resist film 33.

EMBODIMENT 5

Figure 14A:
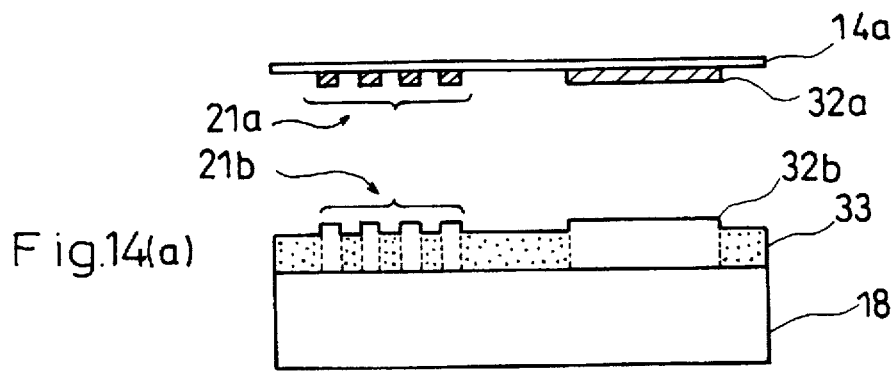
FIGS. 14(a), 14(b), and 14(c) are cross-sections depicting changes in a part of a resist film during resist processing in a fifth embodiment of the present invention.
Figure 14B:
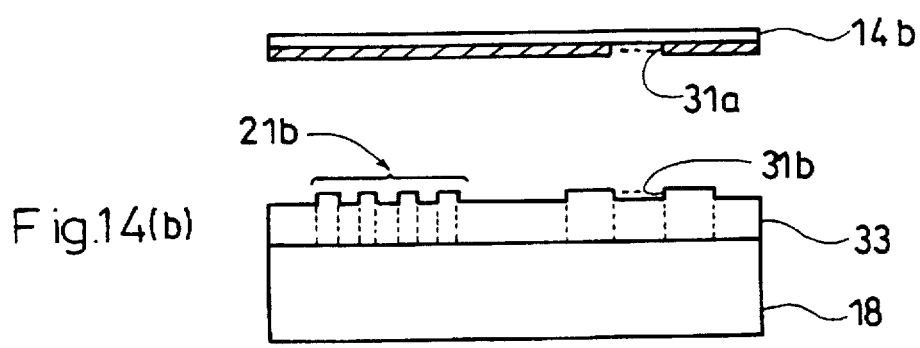
Figure 14C:
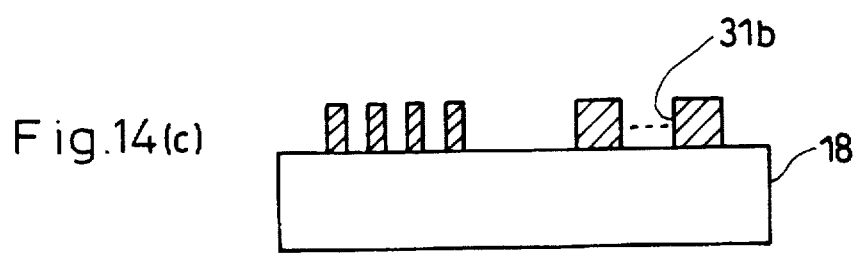

A fifth embodiment of the present invention is explained by making reference to FIGS. 14(a)–14(c).

FIGS. 14(a), 14(b), and 14(c) are cross-sections depicting changes in a part of a resist film during resist processing in the fifth embodiment of the present invention.

As shown in FIG. 14(a), a mask 14a having thereon an alignment mark 21a is set above a semiconductor wafer 18 covered with a resist film 33. A first exposure process is carried out, whereupon an SLD is defined in the resist film 33. Subsequently, as shown in FIG. 14(b), a mask 14b having thereon an OM pattern 31a is set above the wafer 18, and a second exposure process is carried out, whereupon a latent image of an OM pattern 31b is formed at the unexposed region of the resist film 33. At this time, without performing development processing on the resist film 33, the amount of position difference between a reference position and an alignment mark 21b on the wafer 18 is detected by the alignment optical system of FIG. 3 with the aid of the defined SLD. The wafer stage 26 is shifted for alignment of the pattern of the mask 14b to the wafer onto the pattern of which the mask 14a have been transferred. Next, as shown in FIG. 14(c), the resist film 33 is subjected to a development process and the amount of overlay difference is measured using the patterns 32b and 31b. In the case of all of the mark 21a, the OR pattern 32b, and the OM pattern 31a being on the same mask, the second exposure process is carried out after the wafer stage 26 is offset-shifted by a given distance in such a way that patterns 31a and 32b overlap.

In the above-described double exposure process of the present embodiment to expose the resist film 33 for transfer of the alignment mark 21a and the OM pattern 31a, the alignment mark 21a is exposed and thereafter alignment is carried out by making use of a resulting SLD without developing the resist film 33. Conventionally, alignment marks are developed after exposure processing, which produces the inconvenience that the resist film becomes low in solubility due to post-expose development of the OM pattern. The present invention eliminates such inconvenience. Therefore, high-accuracy measurement of the amount of overlay difference can be accomplished.

In the present embodiment, the resist film 33 is developed and thereafter the amount of overlay difference is measured. The amount may be measured by making use of the SLD defined in the resist film 33, without performing development processing on the resist film 33.

EMBODIMENT 6

A sixth embodiment of the present invention is now described below.

Figure 15:
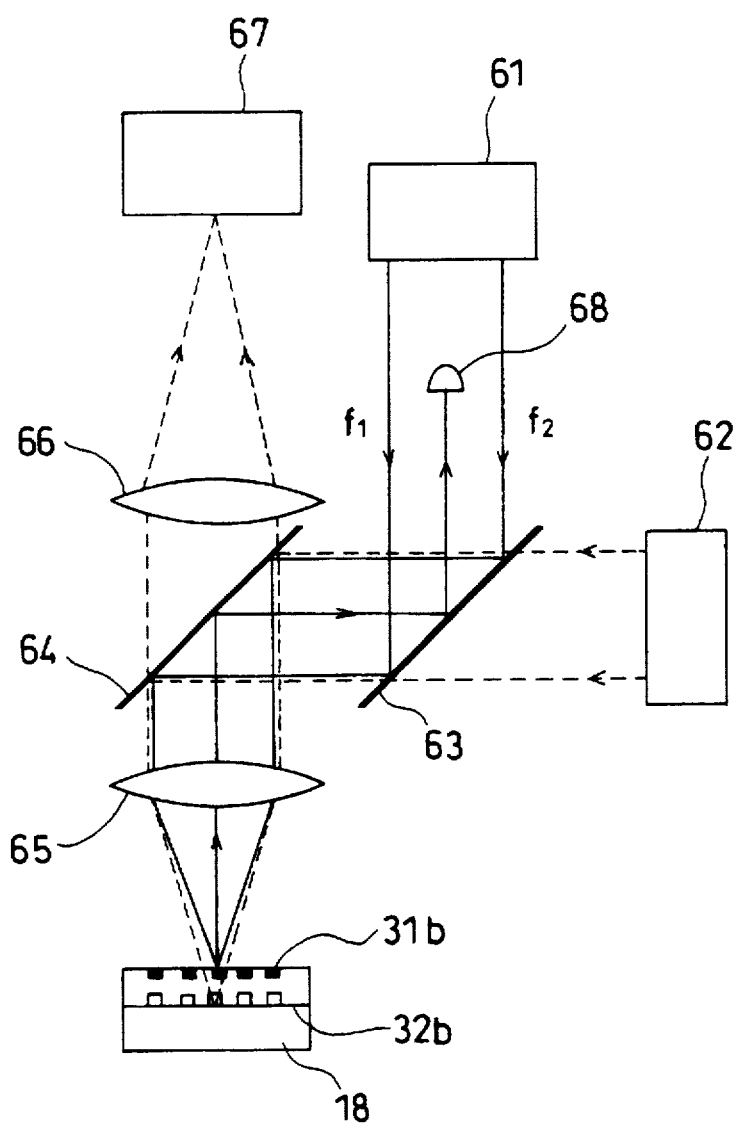
FIG. 15 is a schematic sideview of a system capable of measuring the amount of position difference in accordance with a sixth embodiment of the present invention.
Figure 16:
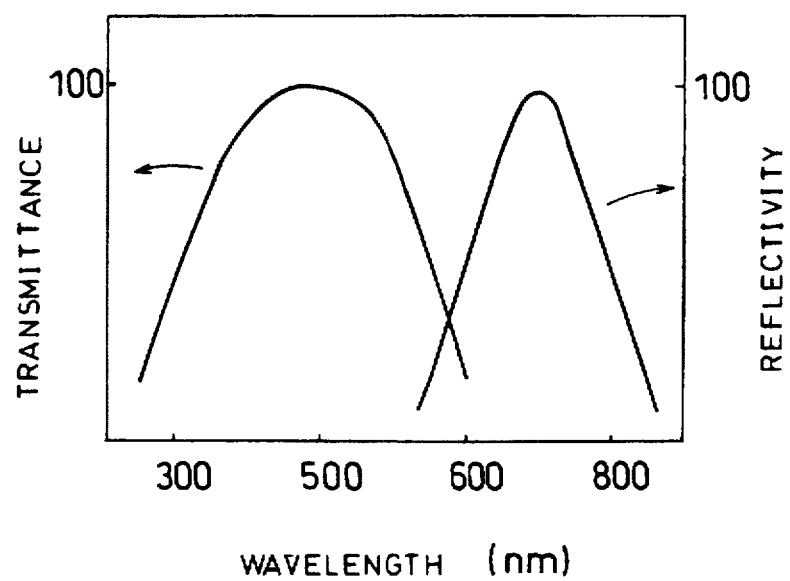
FIG. 16 is a graph showing the transmission rate and the index of reflection of a beam-splitter of the FIG. 15 system.

In the present embodiment, although a first and a second position detector of a position difference amount measurement system are provided with separate light sources, these detectors share a single optical system. In other words, the system is formed of these elements (see FIG. 15): a first light source 61 which emits two light beams that are coherent; a second light source 62 which emits white light beams; a first beam-splitter 63 which aligns the two light beams emitted from the first light source 61 with the light emitted from the second light source 62 so that they have the same optical axis; a second beam-splitter 64 at which light beams from the first beam-splitter 63 are reflected towards the semiconductor wafer 18; a first lens 65 (an objective) which collects light beams received via the second beam-splitter 64 for forwarding to the OR pattern 32b as well as to the OM pattern 31b on the wafer 18; a second lens 66 which collects light beams from the wafer 18 via the second lens 66, for forwarding to a solid-state image sensing device 67; and a photodetector 68 which detects an interference image produced by interference of two light beams. The spectral characteristic of the first beam-splitter 63 (reflectivity and transmittance) is shown in FIG. 16. As can be seen from the graph of FIG. 16, white light beams emitted by the second light source 62 well transmit the first beam-splitter 63 while most of long-wave light beams emitted by the first light source 61 are reflected by the first beam-splitter 63.

Two light beams emitted by the first light source 61, i.e., light beams f1 and f2 of nearly the same frequency, are reflected by the second beam-splitter 64 and cross each other above the OM pattern 31b on the wafer 18. If it is arranged such that the first light source 61 emits 633-nm He—Ne laser light, such laser will undergo total internal reflection off the first beam-splitter 63. As in the second embodiment in which a two-beam interference method is used for position detection, the OM pattern 31b is used to allow the photodetector 68 to detect light beams that are diffracted in the same direction to interfere with one another, whereupon a reference position for the OM pattern 31b is detected. On the other hand, most of white light beams emitted from the light source 62 pass through the first beam-splitter 63, thereafter being directed by the objected 65 towards the OR pattern 32b and being reflected by the OR pattern 32b. Such reflected light is directed by the lens 66 to the solid-state image sensing device 67. More specifically, a reference position for the OR pattern 32b, which becomes an image by the second lens 66, is detected by the device 67. The amount of position difference between the reference position of the OR pattern 32b and the reference position of the OM pattern 31b is calculated.

In the present embodiment, the first and second position detectors share a single optical system. As a result of such arrangement, it becomes possible to determine both a reference position for the OR pattern 32b and a reference position for the OM pattern 31b within the same field. This means that there is no need to shift the wafer stage and hence the amount of position difference between the patterns 32b and 31b can be detected at high accuracy with no stage measurement errors.

EMBODIMENT 7

A seventh embodiment of the present invention, the description of which is not figure-illustrated, is described. The present embodiment employs the principle of the dark-field microscope as a way of measuring both the reference position of the underlying OR pattern and the reference position of the OM pattern formed by exposure processing, by means of a common optical system.

More specifically, both an OR pattern and an OM pattern are illuminated with white light. Thereafter, low-order diffracted light caused by the OR pattern with a great SLD is detected so as to detect a reference position for the OR pattern, while on the other hand higher-order diffracted light caused by the OM pattern with a smaller SLD is detected so as to detect a reference position for the OM pattern, which makes it possible to detect the amount of position difference between the OR pattern and the OM pattern. In order to accomplish such effect, a means capable of switching between transmission characteristics is required. This switch means operates in such a way that, of all the reflection light beams reflected by the OM pattern, only high-order diffracted light is allowed to travel towards the photodetector while, of all the reflection light beams reflected by the OR pattern, only low-order diffracted light is allowed to travel towards the photodetector. Such can be implemented easily by making use of the principle of switching between dark-field and bright-field as used in the microscope. In such a method, high-order diffracted light is detected and therefore an SLD created by exposure processing can be detected at higher sensitivity than by means of bright-field observation for detection of zero-order light.

EMBODIMENT 8

An eighth embodiment of the present invention is described. The present embodiment utilizes the Doppler effect.

Figure 17:
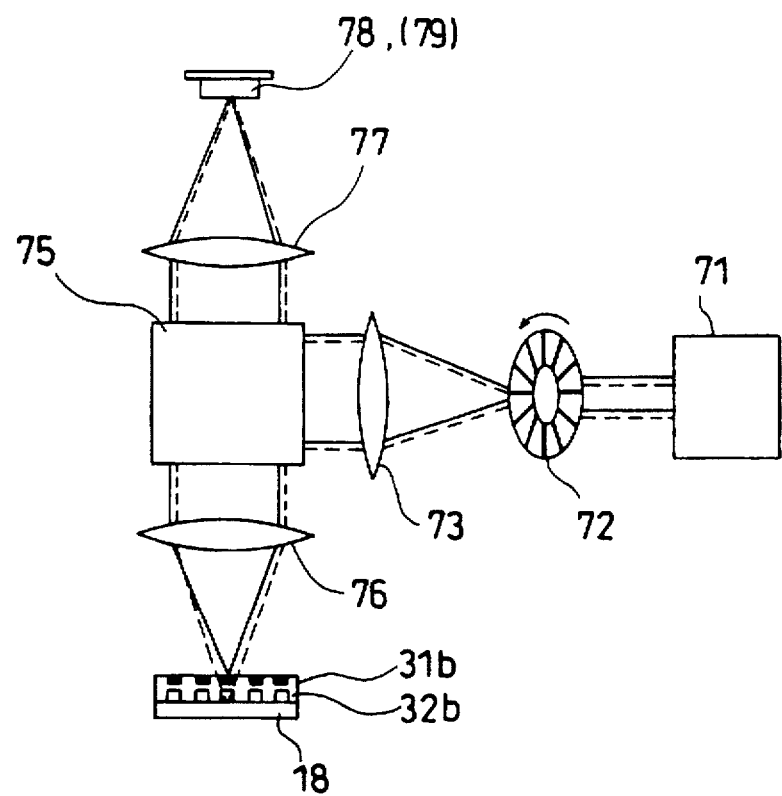
FIG. 17 is a schematic sideview of a system capable of measuring the amount of position difference in accordance with an eighth embodiment of the present invention.

As shown in FIG. 17, a position difference amount measurement system of the present embodiment has these elements: a light-source 71 which emits two light beams of white light and coherent light; a rotation disk 72 which has a radial diffraction grating; a first lens 73 which collimates light beams received from the rotation disk 72; a beam-splitter 75; a second lens 76 which collects light beams received from the beam-splitter 75 for illumination of either one of the OR pattern 32b and the OM pattern 31b on the semiconductor wafer 18; a first photodetector 78 which detects an interference pattern produced by interference of two light beams of coherent light; a second photodetector 79 which detects an interference pattern produced by interference of two light beams of white light; and a third lens 77 which collects light beams via the beam-splitter 75. An image of a scanning slit of the rotation disk 72 illuminated with halogen lamp light and He—Ne laser passes through the lens 73 and then through the lens 76 and is projected upon the OR pattern 32b and upon the OM pattern 31b. A reflection-light signal by a sort of moire image formed by synthesis of the scanning slit image and the patterns 32b and 31b, is detected by each photodetector 78, 79. At this time, a difference in phase between the interference pattern detected by the photodetector 78 and the interference pattern detected by the photodetector 79, when the rotation disk 72 is rotated to scan the scanning slits at a constant speed, is detected in order to detect the amount of position difference between the OR pattern 32b and the OM pattern 31b. In the present embodiment, phase detection is carried out and, as a result, high-accuracy position difference amount measurement can be achieved, even when the intensity of reflection light is low.

EMBODIMENT 9

A ninth embodiment of the present invention is explained. In the present embodiment, the principle of the interference microscope is utilized.

Figure 18:
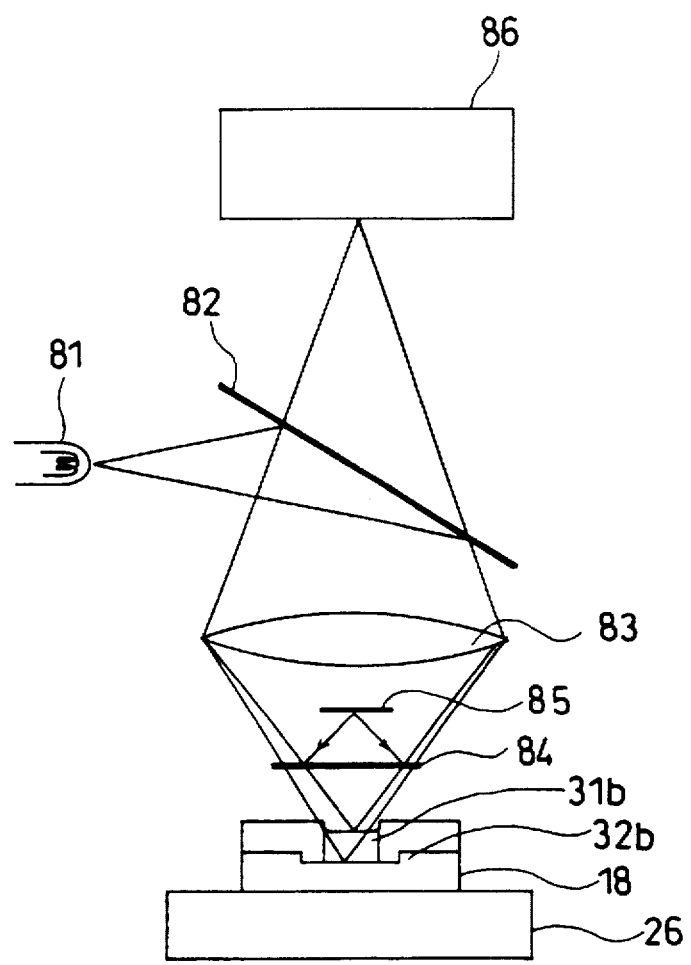
FIG. 18 is a schematic sideview of a system capable of measuring the amount of position difference in accordance with a ninth embodiment of the present invention.

As shown in FIG. 18, a position difference amount measurement system in accordance with the present embodiment has these elements: a light source 81 which is a halogen lamp; a first beam-splitter 82; an objective 83; a second beam-splitter 84 in a Mirau interference objective; a reference mirror 85; and a CCD camera 86 arranged at an imaging plane above the objective 83. White light emitted from the halogen lamp 81 with spacelike spread is reflected by the beam-splitter 82, is collected by the objective 83, and is divided into two parts, one of which is guided to both the OR pattern 32b and the OM pattern 31b and is reflected thereby, and the other of which is guided to the reference mirror 85 and is reflected thereby. These two reflection light beams pass through the first beam-splitter 82 and enter the CCD camera 86 which then determines the intensity of interference of the beams. Then, the wafer stage 26 is moved vertically so that the wafer 18 is scanned in its height direction and, as a result, variation with time in the intensity of interference of the reflection light beams is detected at each pixel on the imaging plane. Both a reference position for the OR pattern 32b and a reference position for the OM pattern 31b are detected, since the interference light intensity becomes maximum at the exposed region surface and unexposed region surface of the OM pattern 31b as well as at the recess portion and projection portion of the OR pattern 32b.

In the present embodiment, white light is used, and an interference pattern, produced by interference of reflection light from the reference mirror 84 and reflection light from each pattern 31b, 32b, is used to detect a reference position for each pattern. Therefore, even when a resist film is applied onto the OR pattern 32b, a reference position for the OR pattern 32b can be measured at a high accuracy, while on the other hand a reference position for the OM pattern 31b can be measured at a high accuracy even if the SLD produced by exposure processing is low.

An optimum amount of resist film exposure dose can be obtained by means of an interference microscope. As described above, variation with time in the intensity of interference of reflection light beams reflected from the exposed and unexposed region surfaces, at the time when the wafer 18 is scanned in its height direction, is detected to measure an SLD defined in the resist film. According to the relationship between exposure dose and SLD as shown in FIG. 7, it becomes possible to measure an optimum energy dose by means of measurement of the SLD.

EMBODIMENT 10

A tenth embodiment of the present invention is described. In the present embodiment, a confocal microscope is used to measure the SLD (surface level difference) to determine an optimum exposure dose.

Figure 19:
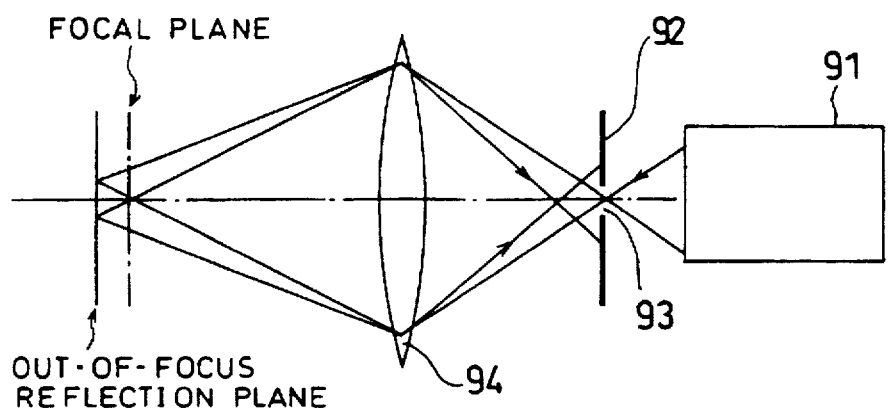
FIG. 19 is a schematic sideview of a system capable of measuring a surface level difference in accordance with a tenth embodiment of the present invention.

As shown in FIG. 19, a confocal microscope used in the present embodiment has a light source 91, a shield plate 92 with a pinhole 93, and an objective 94. The confocal microscope is designed such that light, which is emitted from the light source 91 to pass through the pinhole 93, is focused on a certain point on the wafer by the objective 94, and, when focused on the surface of the resist film, reflection light reflected by the resist film surface is focused on the pinhole 93 and the amount of reflection light reaches a maximum. This makes it possible to detect even a low SLD with high contrast. By making use of the dependency of the SLD upon the exposure dose as shown in FIG. 7, the SLD is determined according to the detected exposure dose, to find an optimum energy dose. If coherent laser serves as illumination light, the SLD can be detected with higher contrast.

Additionally, as in the ninth embodiment, by measuring both a reference position for the OM pattern defined by a latent-image SLD and a reference position for the OR pattern, it becomes possible to measure the amount of overlay difference therebetween.

In the above-described embodiments of this invention, visible light or UV light is used as exposure light. Electromagnetic waves such as X-ray may be used.

Additionally, according to the exposure dose, a resist film region to be exposed may be selectively illuminated with infrared light or UV light at a wavelength above 350 nm via, for example, an optical system for overlay accuracy measurement and thereafter annealing is carried out to foster the speed of resist film thickness variation at the exposed resist film.

The invention claimed is:

1. A resist-pattern measurement method comprising the steps of:
   (a) providing a source of electromagnetic waves including light or radiation capable of performing a function of producing a chemical change in a resist film that is composed of a polymer and an acid generator applied to a surface of a wafer;
   providing a mask having a specific pattern made up of an electromagnetic wave-transmitting region and an electromagnetic wave-shielding region;
   exposing said resist film to electromagnetic waves emitted from said source through said mask;
   (b) leaving said post-exposure resist film without performing a development process thereon, to manifest a resist pattern;
   said resist pattern being made up of an exposed resist region of said resist film that has undergone a change in thickness and an unexposed resist region of said resist film, the thickness of which has remained unchanged;
   (c) measuring a transverse position of said exposed region by sensing reflection light reflected by a surface of said exposed resist region and reflection light reflected by a surface of said unexposed resist region.

2. A resist-pattern measurement method according to claim 1,
   wherein said step (c) is carried out, after there is produced a surface level difference of 0.5 μm or more between said exposed resist region surface and said unexposed resist region surface in said step (b).

3. A resist-pattern measurement method according to either claim 1 or claim 2,
   wherein said exposed region is heated in said step (b).

4. A resist pattern measurement method according to claim 1,
   wherein before said step (a), said wafer is pre-patterned to have a reference pattern having recess portions and projection portions, said method further comprising the steps of:
   (d) detecting a reference position for said reference patter by sensing both reflection light reflection by a surface of said recess portion through said resist film and reflection light reflected by a surface of said projection portion through said resist film;
   wherein in said step (c), a reference position for said resist pattern is detected from reflection light reflected by said exposed resist region surface and reflection light reflected by said unexposed resist region surface, to measure the amount of position difference between said reference position of the reference pattern and said reference position of said resist pattern.

5. A resist-pattern measurement method according to claim 4,
   wherein in said step (d), incoherent light is used, and
   wherein in said step (c), two coherent-light beams are used.

6. A resist-pattern measurement method according to claim 4,
   wherein said mask has a circuit pattern that is used for circuit formation, and master patterns that are used for alignment mark formation, resist pattern formation and reference pattern formation, and
   wherein said master patterns are separated from said circuit pattern by a shield region.

7. A resist-pattern measurement method according to claim 1,
   wherein said mask of said step (a) is a mask having a master pattern for alignment mark formation, a master pattern for reference pattern formation and a master pattern for resist pattern formation, said method further comprising the steps of:
   (e) performing alignment of said wafer with the aid of an alignment mark formed by means of a transfer of said alignment-mark formation master pattern onto said resist film;
   (f) performing a second exposure process in order that said master pattern for resist pattern formation is transferred onto said resist film;
   (g) performing a development process on said resist film, and thereafter measuring the amount of position difference between a reference position for said reference pattern and a reference position for said resist pattern by making use of said resist pattern and said reference pattern.

8. A resist-pattern measurement method according to claim 1,
   wherein in said step (c), an interference microscope is used to detect a variation with time in the intensity of interference of reflection light reflected by said exposed resist region surface and reflection light reflected by said unexposed resist region surface at the time when said wafer is scanned in its height direction, to detect a surface level difference between said exposed resist region and said unexposed resist region;
   said method further comprising the steps of:
   (h) finding, based on said detected surface level difference, a difference between an energy dose of said step (a) and an optimum energy dose by making use of a pre-found correlation between exposure dose and surface level difference.

9. A resist-pattern measurement method according to claim 1,
   wherein in said step (c), a confocal microscope is used to detect a variation with time in the intensity of interference of reflection light reflected by said exposed resist region surface and reflection light reflected by said unexposed resist region surface at the time when said wafer is scanned in its height direction, to detect a surface level difference between said exposed resist region and said unexposed resist region;
   said method further comprising the step of:
   (i) finding, based on said detected surface level difference, a difference between an energy dose of said step (a) and an optimum energy dose by making use of a pre-found correlation between exposure dose and surface level difference.

10. A resist-pattern measurement method according to claim 9,
wherein in said step (c), said confocal microscope is a confocal microscope having a light source which emits beams of coherent light.

11. A resist-pattern measurement method according to claim 1,
wherein said chemically amplified resist is reduced in volume upon exposure to light because of said protecting groups being released.

12. A resist-pattern measurement method according to claim 11,
wherein said chemically amplified resist is composed of a polymer having a chemical composition as indicated by the following chemical formula (1), and an acid generator:

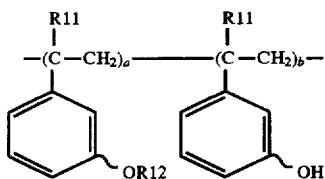  (1)

where R11 is either an atom of hydrogen or a methyl group while R12 is a group having the following formula (2) and is selecting among —Ch$_2$COOR$_{19}$ groups, tert-butoxycarbonyl groups, tetrahydroxypyranyl groups, and trimethylsilyl groups;

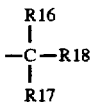  (2)

where:
(i) R16 and R17 each indicate either an atom of hydrogen, or an alkyl group having either a linear chain form or a branching form where the number of atoms of carbon contained therein falls in the range of one to three;

(ii) R18 indicates either an alkyl group having either a linear chain form, or a branching form, or a cycle form where the number of atoms of carbon contained therein falls in the range of one to six, or an alkoxy group having either a branching form or a cycle form where the number of atoms of carbon contained therein falls in the range of one to six;

(iii) R19 is either an alkyl group having a linear line form or a cycle form where the number of atoms of carbon contained therein falls in the range of one to six, or an alkoxy alkyl group having a branching form or a cycle form where the number of atoms of carbon contained therein falls in the range of three to eight.

13. A resist-pattern measurement method according to claim 12,
wherein said acid generator is 5%, on a weight basis, of said polymer.

14. A resist-pattern measurement method according to claim 1,
wherein said step (a) is carried out at an exposure dose that is 1.5 times an exposure dose at which the ration of resist pattern finish size to reticle size is one to one.

15. A resist-pattern measurement method according to claim 1,
wherein in said step (a), a silylation agent is used to silylate hydroxyl groups contained in said resist film.

16. A resist-patter measurement method according to claim 1,
wherein said resist film is formed of a resist material which increases in volume upon exposure to light.

17. A resist-pattern measurement method according to claim 16,
wherein in said step (a), said resist film, formed of a resist material which contains photoacid generator groups, is exposed to ultraviolet light, and is subjected to a CVD process using alkoxysilane vapor for selective generation of polysiloxane in the vicinity of a surface of said exposed resist region of said resist film.

* * * * *

UNITED STATES PATENT AND TRADEMARK OFFICE
CERTIFICATE OF CORRECTION

PATENT NO. : 5,783,342
DATED : July 21, 1998
INVENTOR(S) : YAMASHITA et al.

It is certified that error appears in the above-identified patent and that said Letters Patent is hereby corrected as shown below:

Col. 25, line 62: Delete "patter" and insert --pattern--

Col. 28, line 30: Delete "patter" and insert --pattern--

Col. 28, line 21: Change "1" to read --11--

Signed and Sealed this

Twenty-seventh Day of October, 1998

Attest:

BRUCE LEHMAN

*Attesting Officer*                *Commissioner of Patents and Trademarks*